(12) United States Patent
Chen et al.

(10) Patent No.: US 7,119,621 B2
(45) Date of Patent: Oct. 10, 2006

(54) POWER AMPLIFIER

(75) Inventors: Ning Chen, Beijing (CN); Yasunori Suzuki, Yokohama (JP); Tetsuo Hirota, Kanazawa (JP); Yasushi Yamao, Yokosuka (JP)

(73) Assignee: NTT DOCoMo, Inc., Tokyo (JP)

( * ) Notice: Subject to any disclaimer, the term of this patent is extended or adjusted under 35 U.S.C. 154(b) by 14 days.

(21) Appl. No.: 10/912,116

(22) Filed: Aug. 6, 2004

(65) Prior Publication Data

US 2005/0030104 A1 Feb. 10, 2005

(51) Int. Cl.
*H03F 3/68* (2006.01)

(52) U.S. Cl. .................. 330/295; 330/124 R; 330/136

(58) Field of Classification Search ............ 330/124 R, 330/136, 295

See application file for complete search history.

(56) References Cited

U.S. PATENT DOCUMENTS

| | | | |
|---|---|---|---|
| 5,304,943 A | 4/1994 | Koontz | 330/51 |
| 5,886,573 A | 3/1999 | Kolanek | 330/10 |
| 5,974,041 A | 10/1999 | Kornfeld et al. | 370/342 |
| 6,137,355 A * | 10/2000 | Sevic et al. | 330/124 R |
| 6,255,906 B1 | 7/2001 | Eidson et al. | 330/124 R |
| 2003/0132800 A1 | 7/2003 | Kenington | 330/124 R |

* cited by examiner

*Primary Examiner*—Khanh Van Nguyen
(74) *Attorney, Agent, or Firm*—Oblon, Spivak, McClelland, Maier & Neustadt, P.C.

(57) ABSTRACT

A power amplifier for receiving and amplifying an input signal and outputting an output signal includes N power amplifying units (N is an integer larger than 1) connected in parallel so as to output amplified signals in response to the input signal; an output combining unit for combining the output signals from the N power amplifying units and outputting a combined signal as the output signal of the power amplifier; and an amplitude controlling unit for selectively turning ON each of the N power amplifying units based on an amplitude of the input signal. In the power amplifier, the amplitude controlling unit may includes N amplitude adjusters connected in parallel for adjusting the amplitude of the input signal of the power amplifier; and a controller for selectively turning ON each of the N power amplifying units and controlling the amplitude adjusters so that an amplitude of the output signal becomes a substantially continuous function with respect to the amplitude of the input signal.

19 Claims, 19 Drawing Sheets

FIG. 18
(A) CURRENT COMBINATION
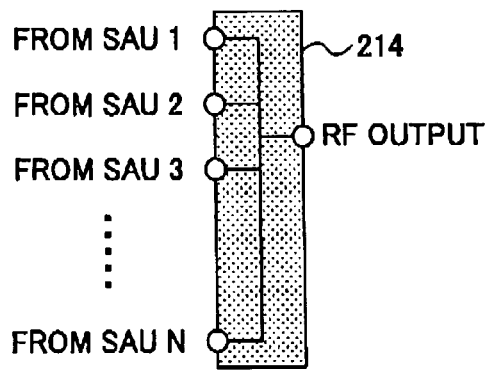
(B) CURRENT COMBINATION + OUTPUT MATCHING CIRCUIT
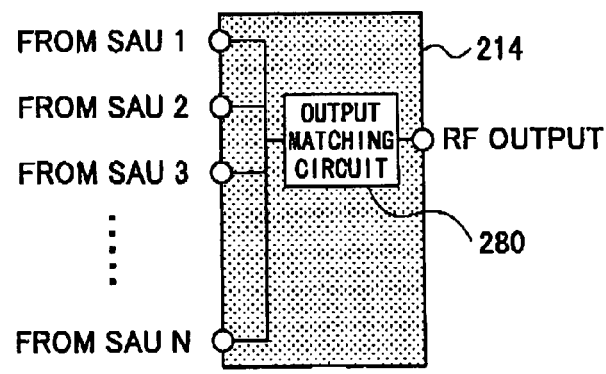
(C) CURRENT COMBINATION + OUTPUT MATCHING CIRCUIT
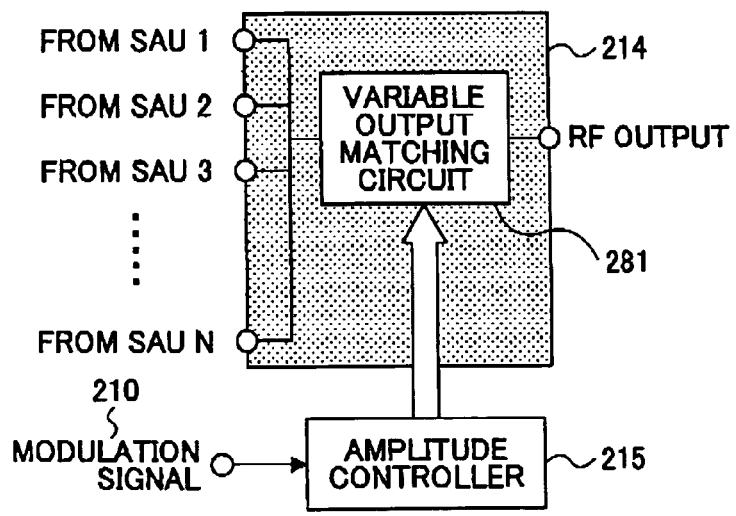

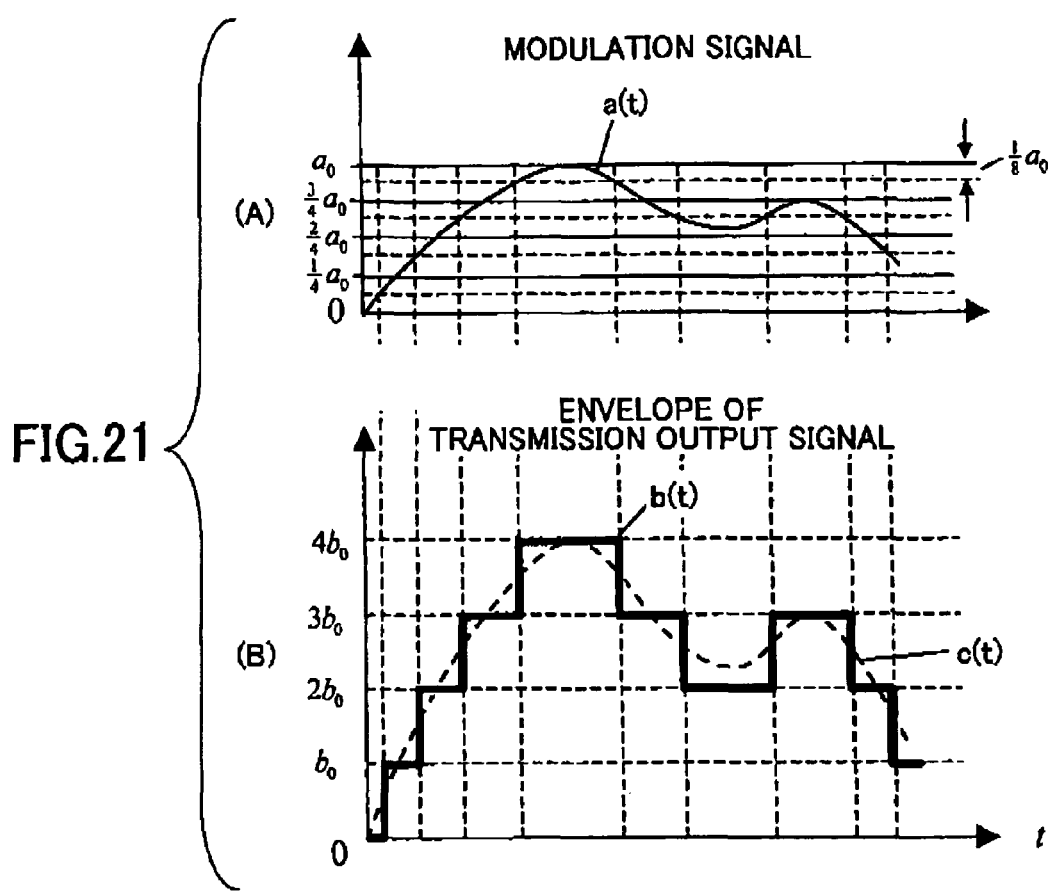

POWER AMPLIFIER

BACKGROUND OF THE INVENTION

The present invention generally relates to power amplifiers, and, more particularly, to a power amplifier which can control its output power to make it continuous, and to a power amplifier which can highly efficiently amplify modulated signals.

One conventional power amplifier is known in the art, in which a plurality of power amplifying units are used in parallel for performing efficient amplification, as shown in "Alireza Shirvani, David K. Su, and Bruce A. Wooley, "A CMOS RF Power Amplifier With Parallel Amplification for Efficient Power Control, "IEEE JOURNAL OF SOLID-STATE CIRCUITS. VOL. 37, NO. 6, JUNE 2002".

FIG. 1 shows a basic structure example of a conventional power amplifier. This conventional power amplifier comprises a plurality of Class F amplifying circuits. Each of the Class F amplifying circuits comprises an FET (Field Effect Transistor), a λ/4 transmission line connected to a drain of the FET, a capacitor C, a tuning circuit, a load, an RF choke coil (RFC) for coupling DC power from a voltage Vdd to the FET, and a driver for supplying a required signal input level to the FET. By connecting the λ/4 transmission lines of all the Class F amplifying circuits together, the combined output signals from the Class F amplifying circuits make a transmission output signal.

Turning off any one of the drivers can prevent a corresponding Class F amplifying circuit from operating.

Each of the Class F amplifying circuits generally has input-output power characteristics (or input-output characteristics) and power efficiency (ratio of output power to DC power supply) to input power characteristics as shown in FIG. 2. When the output power approaches the saturation output power Ps, high efficiency is obtained, but the input-output characteristics becomes significantly non-linear. On the other hand, in an area where the input/output powers are small, the input-output characteristics become linear, but the efficiency is significantly degraded.

When the conventional power amplifier shown in FIG. 1 is used for amplifying constant envelope input signals, the non-linearity of the input-output characteristics does not provide a big problem. Therefore, when each of the Class F amplifying circuits operates near the saturation output power, high efficiency is obtained. In the conventional power amplifier shown in FIG. 1, by controlling the number of operating Class F amplifying circuits, a plurality of levels of transmission output signals can be obtained, that is, the transmission power can be controlled. High efficiency is obtained at different transmission levels.

Another prior art power amplifier is known, in which variable pre-attenuators for two parallel transistor amplifiers are controlled to reduce differences between the operating conditions of these two transistor power amplifying circuits, in order to prevent the mutual modulation distortion of the combined output signal due to transmission frequency variation in a radio transmitter, as shown in Japanese Patent Laid-Open Publication 2001-237651.

The conventional power amplifier shown in FIG. 1 operates well in providing highly efficient amplification and transmission power control of constant envelope signals. However, for amplitude-variable signals, transmission power levels become discrete, and there is a problem that a continuous output power level cannot be attained.

When power amplifying amplitude-variable signals using this conventional power amplifier, transmission output signals have large distortion due to non-linearity of each of the Class F amplifying circuits.

Further, even if the transmission output signals are averaged, the thus obtained average power levels are still discrete, and no continuous average power level can be attained.

SUMMARY OF THE INVENTION

A general object of the present invention is to provide a power amplifier which can provide continuous output power for constant envelope signals, and can amplify highly efficiently for amplitude-variable signals, and can provide continuous average output power.

Another object of the present invention is to provide a highly efficient power amplifier in which amplitude-variable output signals can be generated with small distortion and high efficiency.

The above object of the present invention is achieved by a power amplifier for receiving and amplifying an input signal and outputting an output signal, which comprises: N power amplifying units (N is an integer larger than 1) connected in parallel so as to output amplified signals in response to the input signal; an output combining unit for combining the output signals from the N power amplifying units and outputting a combined signal as the output signal of the power amplifier; and an amplitude controlling unit for selectively turning ON each of the N power amplifying units based on an amplitude of the input signal.

In the power amplifier, the amplitude controlling unit may comprise N amplitude adjusters connected in parallel for adjusting the amplitude of the input signal of the power amplifier; and a controller for selectively turning ON each of the N power amplifying units and controlling the amplitude adjusters so that an amplitude of the output signal becomes a substantially continuous function with respect to the amplitude of the input signal.

The power amplifier may further comprise a local oscillator outputting an constant envelope signal, receiving a modulation signal as the input signal of the power amplifier and outputting an amplified modulated signal as the output signal of the power amplifier; wherein the N power amplifying units comprise N saturation amplifying units connected in parallel so as to amplify the constant envelope signal from the local oscillator; and the amplitude controlling unit comprises an amplifying controller for selectively turning ON each of the N saturation amplifying units based on an amplitude of the modulation signal.

In a power amplifier according to the present invention, output power can be a continuous function of input power, wherein highly efficiently controlled transmission power having continuous levels is obtained.

In a power amplifier according to one embodiment of the present invention, non-linear input-output characteristics of each power amplifying unit can be compensated for, to obtain equivalent linear amplifying units. And the equivalent linear amplifying units can be selectively combined in response to instantaneous power of an input signal, to provide a linear and highly efficient power amplifier. Accordingly, even an amplitude-variable signal can be highly efficiently and linearly amplified. Further, a power amplifier using N power amplifying units can extend a highly efficiently amplifiable input/output power range by increasing the value of N. This merit is especially advantageous when amplifying amplitude-variable signals having a large peak-to-average power ratio. In this case, by adjusting the average power of the input signals, the output signal average power can be continuously controlled.

In a power amplifier according to another embodiment of the present invention, by controlling the number of operating saturation amplifying units in response to an amplitude of a received modulation signal, an AM transmission output signal or a QAM transmission output signal can be generated. Since each of the saturation amplifying units amplifies an constant envelope signal from a local oscillator only, the amplification can be performed highly efficiently. Therefore, the total efficiency of the power amplifier becomes high. Further, by increasing the number of the saturation amplifying units or providing a linear amplifying unit for compensating for an error component, transmission output signals with low distortion can be attained.

BRIEF DESCRIPTION OF THE DRAWINGS

FIG. 18 is a block diagram of an output combining circuit according to an embodiment of the present invention;

FIG. 21 is a graph illustrating a modulation signal and a transmission output signal according to an embodiment of the present invention.

DESCRIPTION OF THE PREFERRED EMBODIMENTS

The present invention can be applied especially to a power amplifier in a radio communication transceiver in no limiting sense, and can be applied to other-purpose power amplifiers. The following is a description of embodiments of the present invention, with reference to the accompanying drawings.

Figure 3:
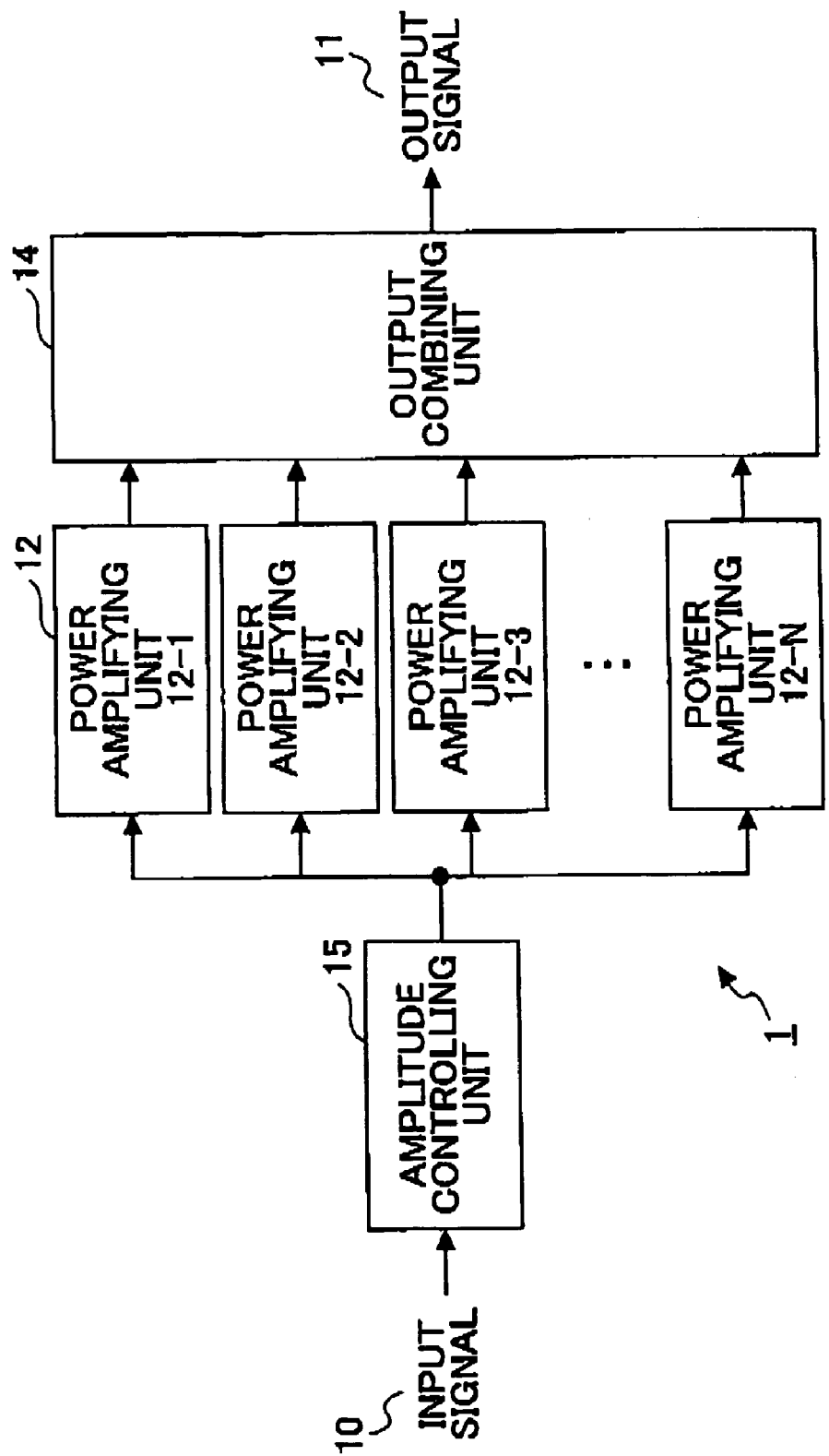
FIG. 3 is a block diagram of a power amplifier according to a basic embodiment of the present invention.

FIG. 3 schematically illustrates a power amplifier 1 according to a basic embodiment of the present invention. The power amplifier 1 comprises N power amplifying units 12 (N is an integer larger than 1), an output combining unit 14 and an amplitude controlling unit 15. In this embodiment, power of a transmission input signal 10 is adjusted by the amplitude controlling unit 15, and the adjusted power level is supplied to each of the power amplifying units 12. The amplitude controlling unit 15 controls the power amplifying units 12 and turns on/off each of them, in response to the input signal 10. The output combining unit 14 combines output signals supplied from power amplifying units 12 that are operating (turned on) to make a power sum, and outputs it as a transmission output signal 11 of the power amplifier 1.

Figure 1:
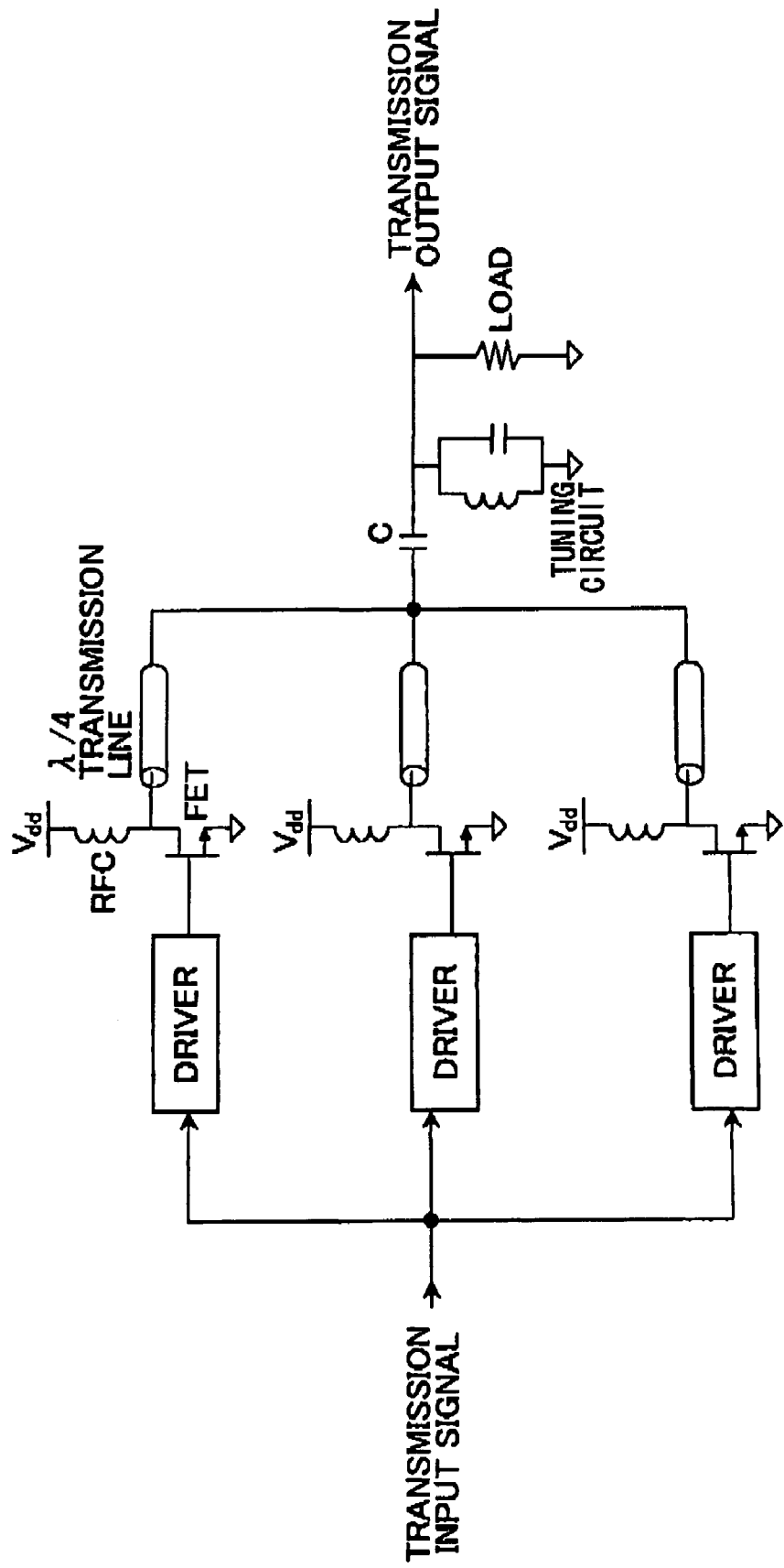
FIG. 1 is a block diagram of a conventional power amplifier.
Figure 2:
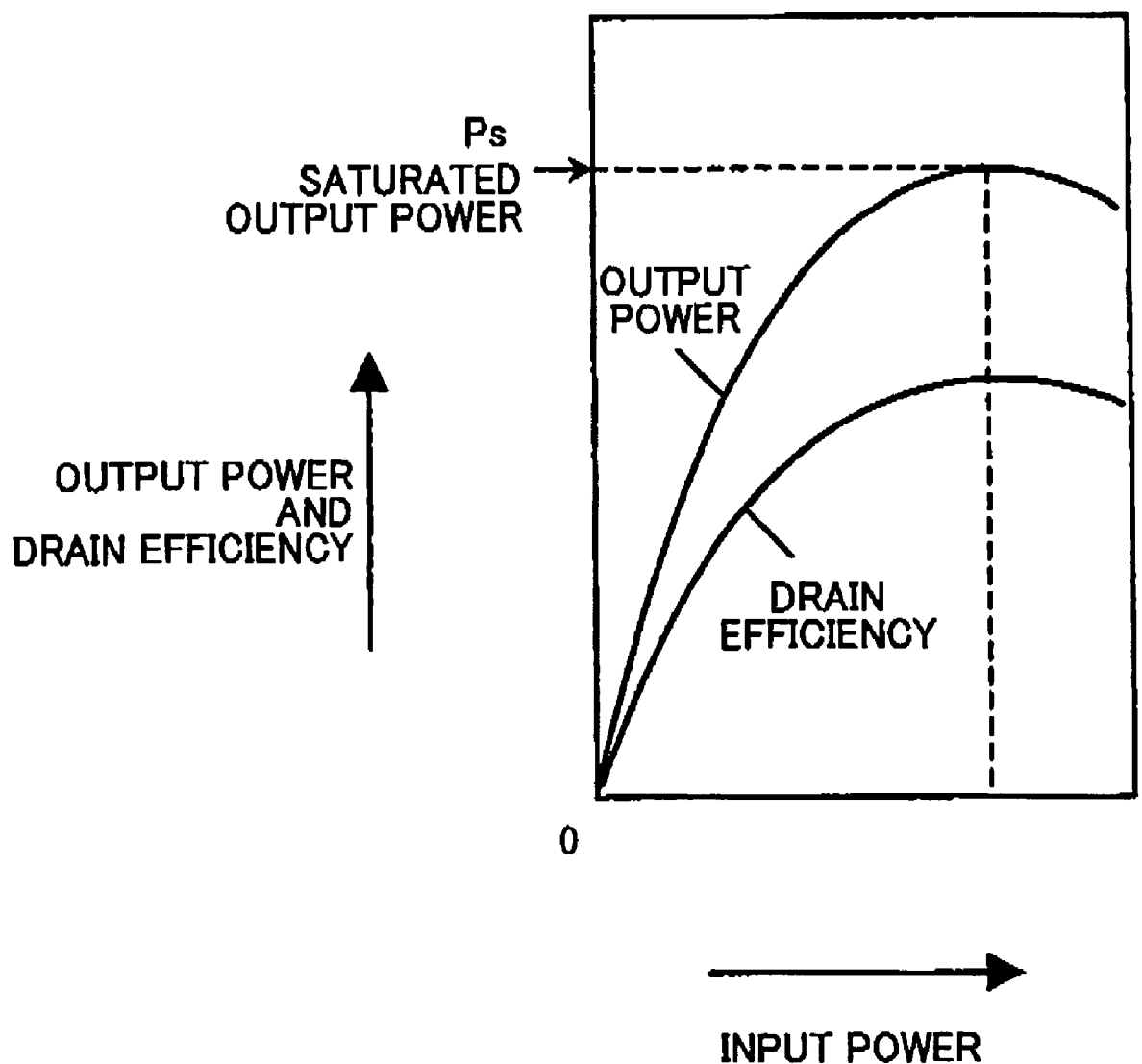
FIG. 2 is a graph illustrating input-output power characteristics of an Class F amplifying circuit.

The power amplifying units 12 may be amplifying circuits employing amplifying devices such as FETs. Their input-output characteristics and efficiency characteristics are generally similar to those of Class F amplifiers as shown in FIG. 2. When the saturation output power of the power amplifying units 12 is represented by Ps, the closer to the saturation output power Ps their outputs are, the higher their efficiencies are.

The amplitude controlling unit 15 may comprise a circuit employing a microprocessor, and can control other circuit devices based on the transmission input signal 10.

The amplitude controlling unit 15 controls a power adjusting coefficient of an input signal to the power amplifying units 12, and turns on/off each of the N power amplifying units so that an amplitude of the transmission output signal 11 becomes a continuous function with respect to the amplitude of the transmission input signal 10.

First Embodiment

Figure 4:
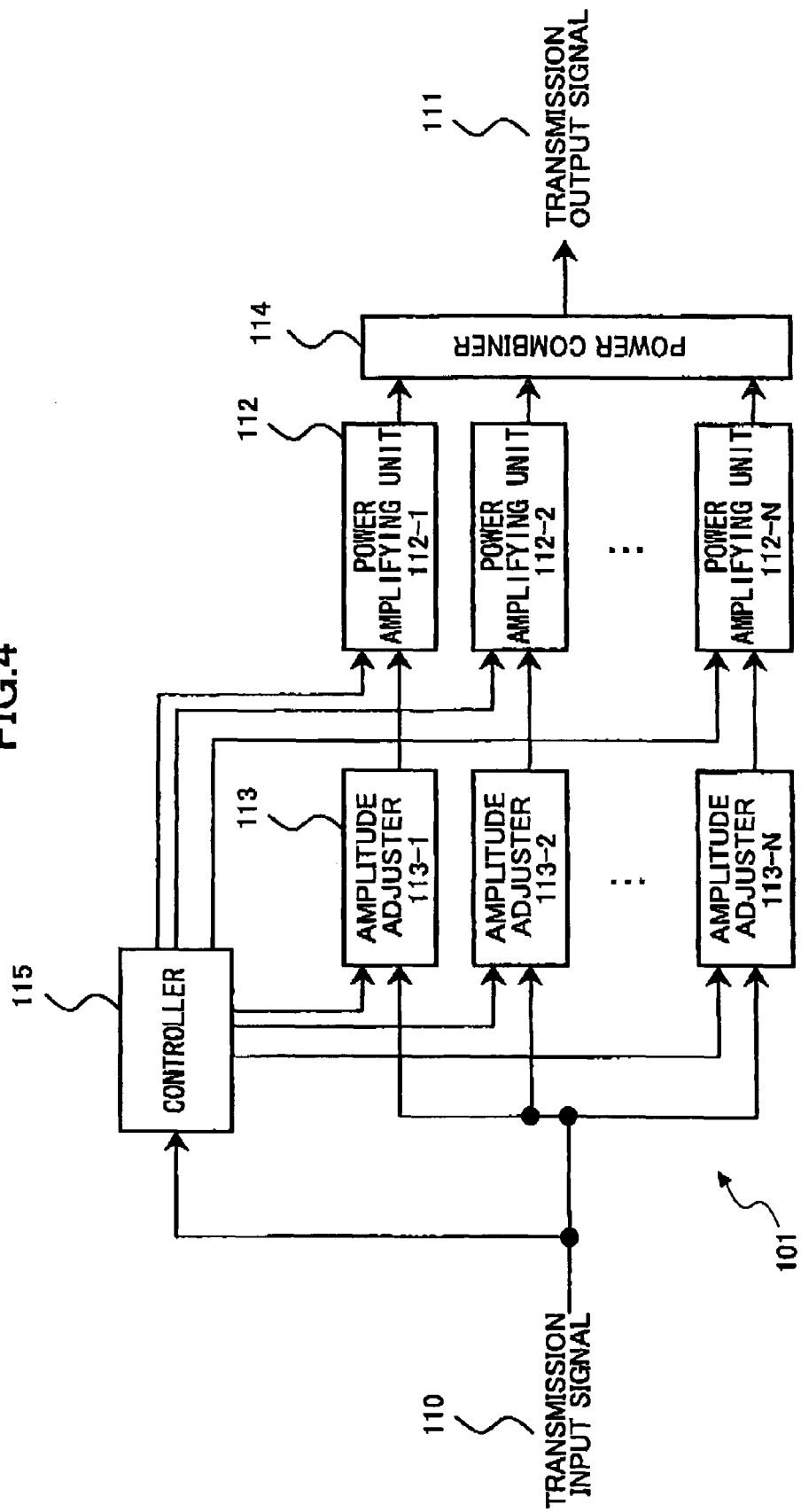
FIG. 4 is a block diagram of a power amplifier according to a first embodiment of the present invention.

FIG. 4 schematically illustrates a power amplifier 101 according to a first embodiment of the present invention. The power amplifier 101 comprises N power amplifying units 112 (N is an integer larger than 1), N amplitude adjusters 113, an output combining unit 114 and a controller 115. In this embodiment, the amplitude controlling unit 15 comprises the N amplitude adjusters 113 and the controller 115. Power of a transmission input signal 110 is adjusted by each of the amplitude adjusters 113, and each adjusted power level is supplied to the respective one of the power amplifying units 112. The controller 115 controls a power adjusting coefficient of each of the amplitude adjusters 113, and turns on/off each of the N power amplifying units, in response to the input signal 110. The output combining unit 114 combines output signals supplied from power amplifying units 112 that are operating (turned on) to make a power sum, and outputs it as a transmission output signal 111 of the power amplifier 101.

The power amplifying units 112 may be amplifying circuits employing amplifying devices such as FETs. Their input-output characteristics and efficiency characteristics are generally similar to those of Class F amplifiers as shown in FIG. 2. When the saturation output power of the power amplifying units 112 is represented by Ps, the closer to the saturation output power Ps their outputs are, the higher their efficiencies are.

The controller 115 may comprise a circuit employing a microprocessor, and can control other circuit devices based on the transmission input signal 110.

The amplitude adjusters 113 may be any known adjusters, and adjust an amplitude of the transmission input signal 110 in response to control signals from the controller 115.

The controller 115 controls power adjusting coefficients of the amplitude adjusters 113, and turns on/off each of the N power amplifying units 112 so that an amplitude of the transmission output signal 111 becomes a continuous function with respect to the amplitude of the transmission input signal 110. This controlling manner is explained below for a case where N=2 with reference to FIG. 8.

Figure 8:
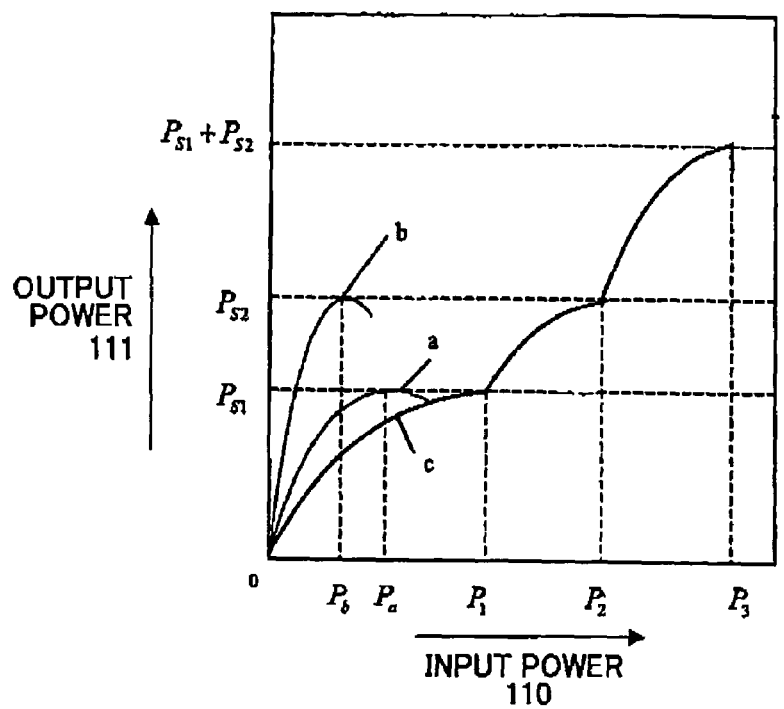
FIG. 8 is a graph illustrating input-output power characteristics of the power amplifier according to the first embodiment of the present invention.

In a graph shown in FIG. 8, curves a and b illustrate input-output characteristics of the power amplifying units 112-1 and 112-2, respectively. The relation between the transmission input signal 110 and desired transmission output signal 111 is illustrated by a curve c. In this graph, the saturation output powers of the two power amplifying units 112-1 and 112-2 are represented by $Ps_1$ and $Ps_2$ ($Ps_1$ is smaller than $Ps_2$) respectively, their corresponding input powers are represented by Pa and Pb respectively, and x is the power of the transmission input signal 110.

With respect to predetermined input power levels $P_1$, $P_2$ and $P_3$, when the transmission input signal power x is within the range of $x \leq P_1$, only the power amplifying unit 112-1 is selected (turned on). A power adjusting coefficient of the amplitude adjuster 113-1 is so adjusted that an input to the power amplifying unit 112-1 varies from 0 to Pa as x varies from 0 to $P_1$. Therefore, the power amplifying unit 112-1 can output power from 0 to $Ps_1$.

Next, when the transmission input signal power x is within the range of $P_1 < x \leq P_2$, only the power amplifying unit 112-2 is selected (turned on). A power adjusting coefficient of the amplitude adjuster 113-2 is so adjusted that the power amplifying unit 112-2 can output power $Ps_1$ to $Ps_2$ as x varies from $P_1$ to $P_2$.

Further, when the transmission input signal power x is within the range of $P_2 < x \leq P_3$, both the power amplifying units 112-1 and 112-2 are selected (turned on). The power adjusting coefficients of the amplitude adjuster 113-2 are so adjusted that the sum of the output powers from the power amplifying units 112-1 and 112-2 becomes $PS_2$ to $Ps_1 + Ps_2$, as x varies from $P_2$ to $P_3$.

In this manner, the power of the transmission output signal 111 can be continuous from 0 to $(Ps_1 + Ps_2)$ as shown in FIG. 8. In a range where the transmission input signal power x is larger than $P_1$, it is possible to make the power amplifying units 112-1 and 112-2 operate near to their saturation output power levels, resulting in high efficiency.

In a power amplifier according to the first embodiment shown in FIG. 4, continuous input-output characteristics can be realized in a range where the output power is from 0 to $\Sigma Ps_i$ ($Ps_i$ means the saturation output power of the ith power amplifying unit 112-$i$). In addition, high efficiency is obtained in a range where the transmission input signal power x is larger than Ps1 (assuming $Ps_1 < Ps_i$, i=2, 3, . . . , N). When the input-output power characteristic is continuous, an input-output amplitude characteristic is also continuous.

Second Embodiment

Figure 5:
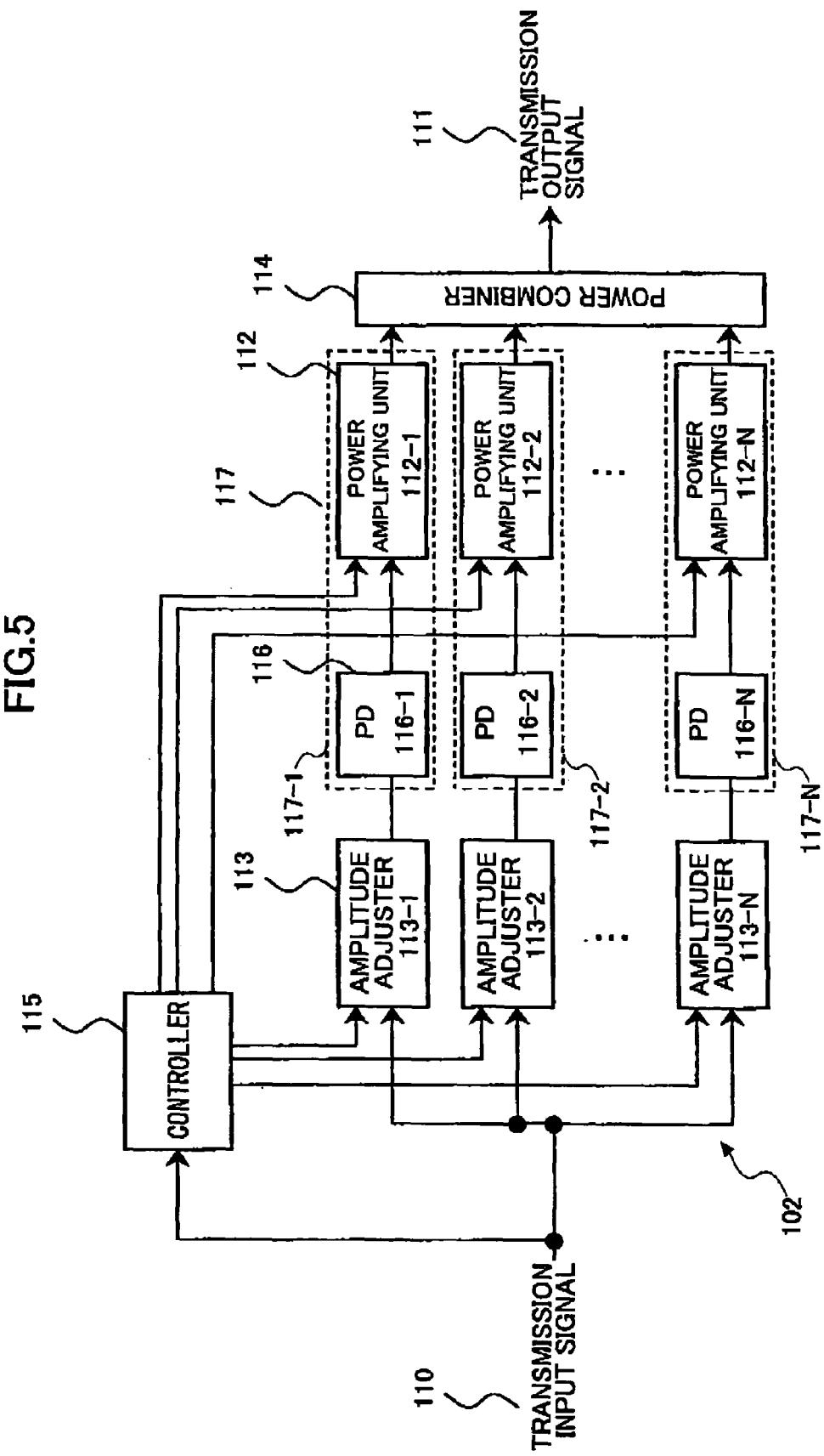
FIG. 5 is a block diagram of a power amplifier according to a second embodiment of the present invention.

FIG. 5 shows a power amplifier 102 according to a second embodiment of the present invention. The power amplifier 102 is the same as the power amplifier 101 except that the power amplifier 102 comprises pre-distorters (PDs) 116 inserted between the amplitude adjusters 113 and the power amplifying units 112. The N pre-distorters, PD 116 and the corresponding N power amplifying units 112 constitute N equivalent linear amplifiers 117. Each of the equivalent linear amplifiers 117 has the same gain G.

Figure 9:
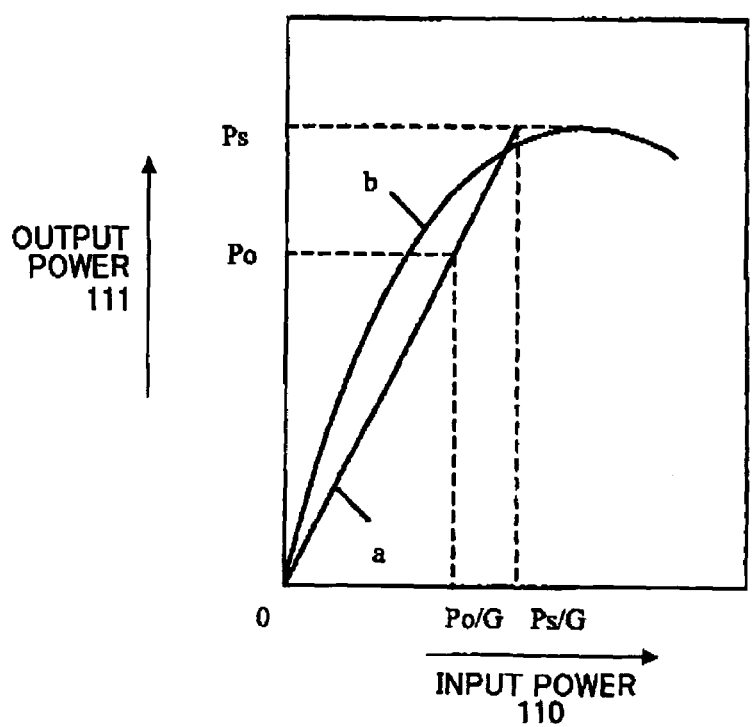
FIG. 9 is a graph illustrating input-output power characteristics of the power amplifier according to the second embodiment of the present invention.

FIG. 9 shows a graph illustrating input-output characteristics (curve a) of each equivalent linear amplifier 117 and input-output characteristic (curve b) of the power amplifying unit 112. The saturation output power of the power amplifying unit 112 is represented by Ps, and the equivalent linear amplifying unit 117 can have a linear input-output characteristic in a range where its output varies from 0 to Ps. The efficiency of the equivalent linear amplifier 117 is equal to the efficiency of the power amplifying unit 112 at a specific output power (for example P0 shown in FIG. 9). Therefore, the efficiency of the equivalent linear amplifier 117 becomes higher as its output comes closer to its maximum output power Ps.

Returning to FIG. 5, the controller 115 turns on/off the N power amplifying units 112 (that is, turns on/off the equivalent amplifiers 117), and properly controls power adjusting coefficients of the amplitude adjusters 113. This control manner is explained below for a case where N=2, with reference to FIG. 10.

Figure 10:
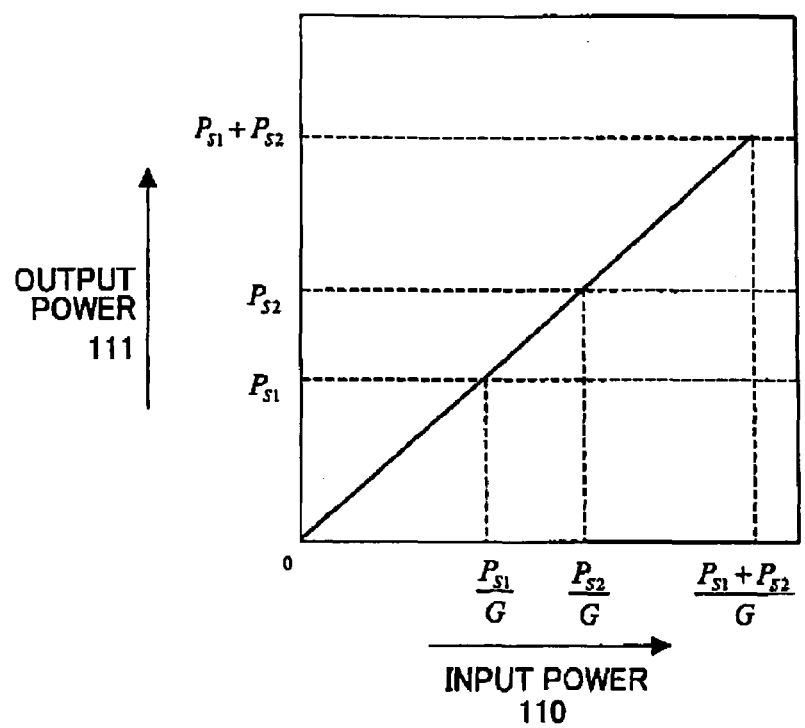
FIG. 10 is a graph illustrating input-output power characteristics of an equivalent linear amplifier according to the second embodiment of the present invention.

In a graph shown in FIG. 10, the maximum output power levels of the two equivalent linear power amplifiers 117-1 and 117-2 are represented by $Ps_1$ and $Ps_2$ ($Ps_1$ is smaller than $Ps_2$) respectively. When the transmission input signal power x is within the range of $x \leq (Ps_1/G)$, only the equivalent linear amplifier 117-1 is selected (turned on). A power adjusting coefficient of the amplitude adjuster 113-1 is adjusted to 1 so that the transmit output signal 111 becomes Gx.

Next, when the transmission input signal power x is within the range of $(Ps_1/G) < x \leq (Ps_2/G)$, only the equivalent linear amplifier 117-2 is selected (turned on). A power adjusting coefficient of the amplitude adjuster 113-2 is adjusted to 1 so that the transmit output signal 111 becomes Gx also.

Further, when the transmission input signal power x is within the range of $(Ps_2/G) < x \leq [(Ps_1 + Ps_2)/G]$, both the equivalent linear amplifier 117-1 and 117-2 are selected (turned on), and the power adjusting coefficients of the amplitude adjusters 113-1 and 113-2 are adjusted to $Ps_1/(Ps_1+Ps_2)$, $Ps_2/(Ps_1+Ps_2)$, respectively. As a result, the power of the transmission output signal 111 becomes $G[Ps_1/(Ps_1+Ps_2)]x + G[Ps_2/(Ps_1+Ps_2)]x = Gx$. In this manner, the power of the transmission output signal 111 can be continuous within the range from 0 to $(Ps_1 + Ps_2)$ as shown in FIG. 10. In a range where the transmission input signal power x is larger than $Ps_1/G$, the equivalent linear amplifier 117-1 and 117-2 operate close to their maximum output power and therefore are high efficient.

In a power amplifier according to the second embodiment shown in FIG. 5, continuous input-output characteristics can be realized in a range where the output power varies from 0 to $\Sigma Ps_i$ ($Ps_i$ means the saturation output power of the ith equivalent linear amplifier 117-i). And high efficiency can be attained in a range where the transmission input signal power x is larger than $Ps_1/G$ (assuming $Ps_1<Ps_i$, i=2, 3, . . . , N).

On the other hand, when the transmission input signal 111 is an amplitude-variable signal, the controller 115 can control the amplitude adjusters 113 and selects equivalent linear amplifiers 117 in response to an instantaneous value of the transmission input signal 110, to attain linear amplification.

Third Embodiment

Figure 6:
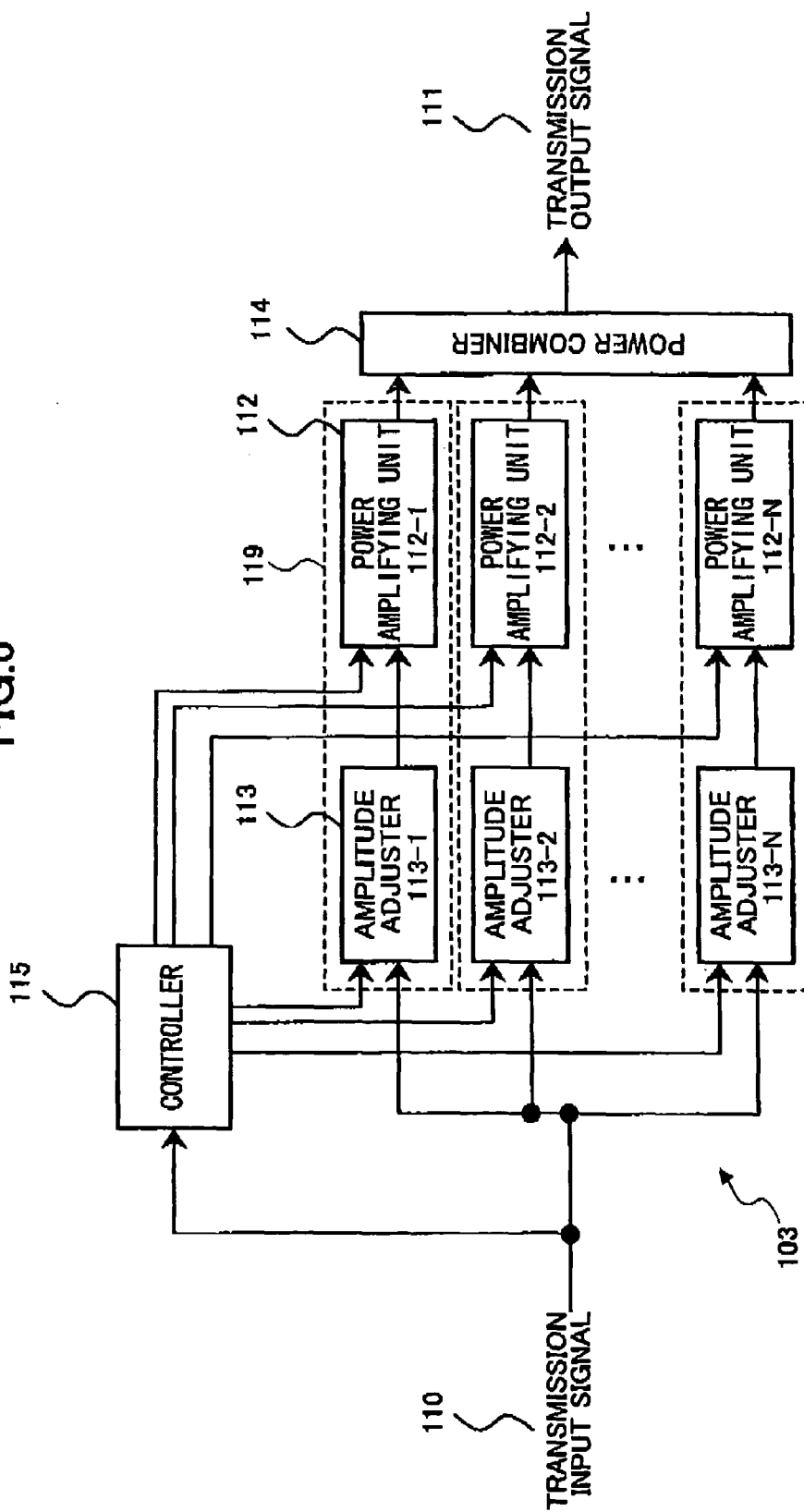
FIG. 6 is a block diagram of a power amplifier according to a third embodiment of the present invention.

FIG. 6 shows a power amplifier 103 according to a third embodiment of the present invention. The power amplifier 103 is the same as the power amplifier 102 except that in the power amplifier 103, the non-linearity of each of the power amplifying units 112 is compensated for by the amplitude adjusters 113 instead of the PDs 116. In this embodiment, power adjustment amounts for the amplitude adjusters 113 comprise a first adjustment amount for the equivalent linear amplifier 119 for compensating for the non-linearity of the power amplifying units 112, and a second adjustment amount for so adjusting that the transmission input signal is within an input range of the equivalent linear amplifier 119.

Figure 11:
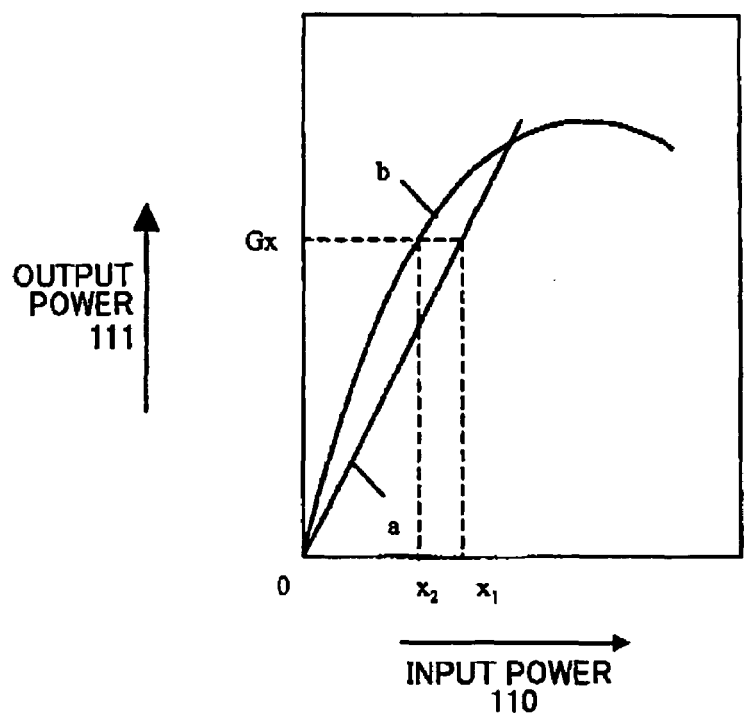
FIG. 11 is a graph illustrating compensation of non-linearity of the power amplifying units by amplitude adjusters according to the third embodiment of the present invention.

As for each amplitude adjuster 113, an equivalent linear amplifier 119 having a gain of G, a maximum output of Ps is formed, and the second adjustment amount is adjusted in the same manner as the second embodiment shown in FIG. 5. The power of the transmission input signal 110 which is adjusted by the second adjustment amount, is represented by $x_1$ in FIG. 11. A desired output power 111 corresponding to the power $x_1$ is $Gx_1$, and therefore the adjusters 113 further adjust $x_1$ to $x_2$ so that the power amplifying units 112 output $Gx_1$. The total power adjustment amount of the amplitude adjusters 113 becomes a product of the first adjustment amount and the second adjustment amount.

Fourth Embodiment

In the embodiment shown in FIG. 5 or 6, a maximum output power of each of the equivalent linear amplifiers 117 or 119 can be adjusted to be equal to each other. In this case, the controller 115 can control the power amplifying units 112 and the amplitude adjusters 113 in a manner explained below. Supposing that the maximum output power of each equivalent linear amplifier 117, 119 is Ps, and r means an integer from 1 to N, when the transmission input signal power x is within the range of $[(r-1)Ps/G]<x \leq (rPs/G)$, r power amplifying units are selected, and power control coefficients of corresponding amplitude adjusters 113 are set at 1/r. Accordingly, each of the operating equivalent linear amplifiers 117, 119 outputs power of G(1/r)x, and the power of the transmission output signal 111 becomes Gx.

In the above range of x, output power of each of the operating equivalent linear amplifiers 117, 119 is within the range of [Ps(r-1)/r] to Ps. In the case where r is not equal to 1 (that is, x is larger than Ps/G), each of the operating equivalent linear amplifiers 117, 119 operates near to the maximum output power, and therefore is highly efficient. This high efficient amplification is attained for input-output power within the range of 10 log (N) (dB).

Fifth Embodiment

In the embodiment shown in FIG. 5 or 6, a maximum output power of the ith (i=1, 2, . . . , N) equivalent linear amplifiers 117 or 119 can be set at $2^{(i-1)}Ps$. In this case, the controller 115 can control the power amplifying units 112 and the amplitude adjusters 113 in a manner explained below. Supposing that r means an integer from 1 to (2N−1), when the transmission input signal power x is within the range of $[(r-1)Ps/G]<x \leq (rPs/G)$, r can be represented by N digit binary number. In this binary number in which the LSB is the first digit and the MSB is the last Nth digit, values of some digits are zero and the others are one. Among the equivalent linear amplifiers 117, 119, equivalent linear amplifiers corresponding to digits having one value operates. And power adjustment coefficients of amplitude adjusters 113 corresponding to the ith operating equivalent linear amplifier 117, 119 are set at 2(i−1)/r. In this way, the ith operating equivalent linear amplifier 117, 119 outputs power of G[2(i−1)/r]x, the transmission output signal power is $\Sigma\{G[2(i-1)/r]x\}$, and $\Sigma 2^{(i-1)}=r$. Therefore, the power of the transmission output signal 111 becomes Gx.

In the above range of x, output power of each of the operating equivalent linear amplifiers 117, 119 is within the range of [Ps(r−1)/r] to Ps. In the case where r is not equal to 1 (that is, x is larger than Ps/G), each of the operating equivalent linear amplifiers 117, 119 operates near to the maximum output power, and therefore is highly efficient. This high efficient amplification is attained for input-output power within the range of 10 log ($2^N$−1) (dB).

Sixth Embodiment

In any of the above explained embodiments, the controller 115 can establish a power adjustment amount α for the amplitude adjusters 113, based on average power of desired transmission output signal 111. That is, the controller 115 can calculate a product of a power adjustment coefficient established in response to instantaneous power of the transmission input signal 110 shown in the above embodiments and a the power adjustment amount α. And the controller 115 can supply the product to the amplitude adjusters 113. The power adjustment amount α can be established in response to the average power of a desired transmission signal 111. When this power adjustment is applied to the above embodiment, continuous transmission power control can be attained for constant envelope signal. When this power adjustment is applied to the second to fifth embodiments, continuous transmission power control can be attained for amplitude-variable signal.

Seventh Embodiment

Figure 7:
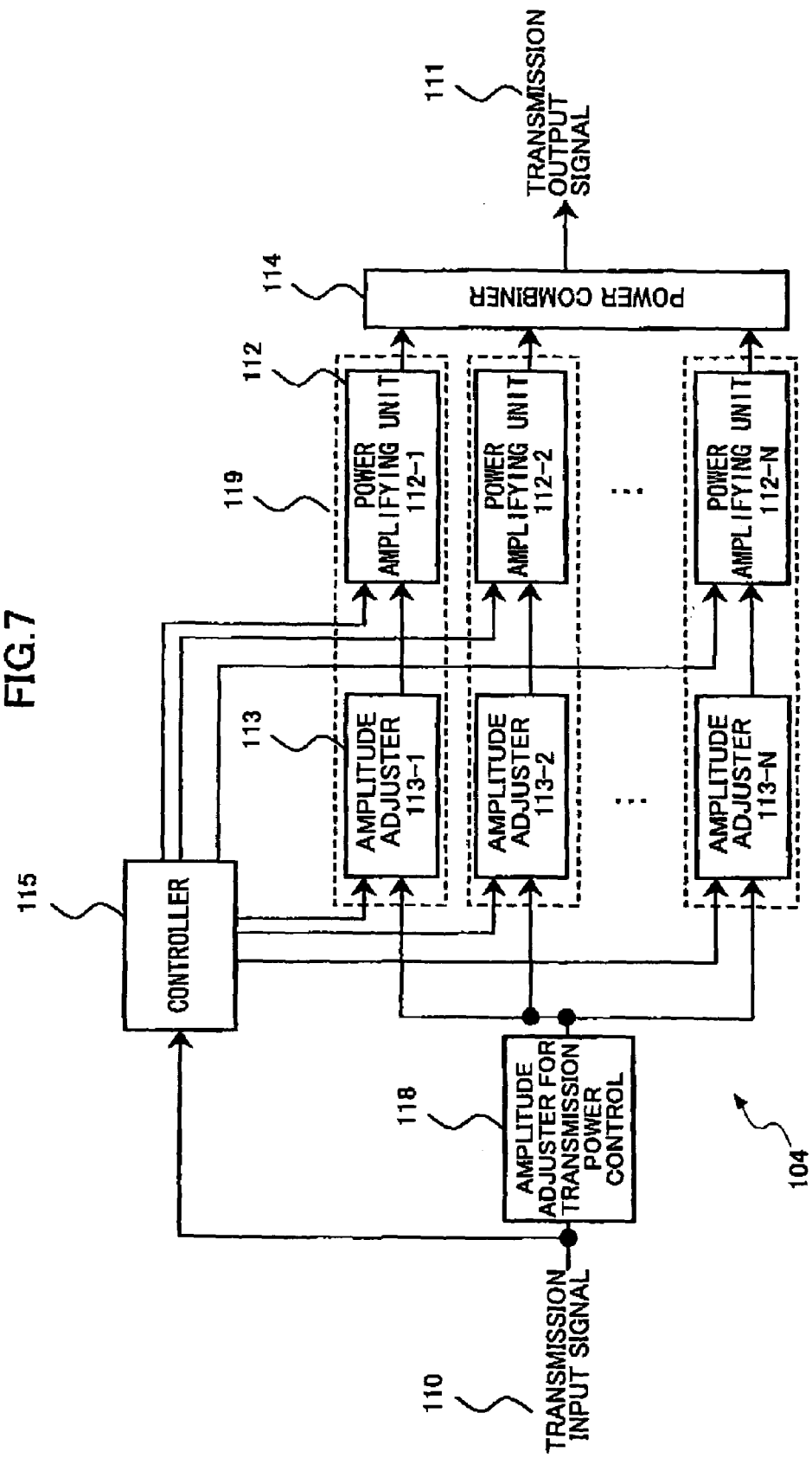
FIG. 7 is a block diagram of a power amplifier according to a seventh embodiment of the present invention.

FIG. 7 shows a power amplifier 104 according to a seventh embodiment of the present invention. The power amplifier 104 is the same as the power amplifier 103 shown in FIG. 6 except that in the power amplifier 104, a transmission input signal 110 is supplied to each amplitude adjuster 113 via an amplitude adjuster for transmission power control 118. The controller 115 can establish a constant power adjustment amount α to the amplitude adjuster for transmission power control 118, in response to average power of a desired transmission output power 111. The amplitude adjuster for transmission power control 118 can be applied not only to the embodiment shown in FIG. 6, but also to the embodiments shown in FIGS. 4 and 5.

Embodiments in which the present invention is applied to high efficient transmission signal generators are explained below. The present invention is not limited to transmission signal generators but can be applied to any kinds of power amplifiers.

Eighth Embodiment

Figure 12:
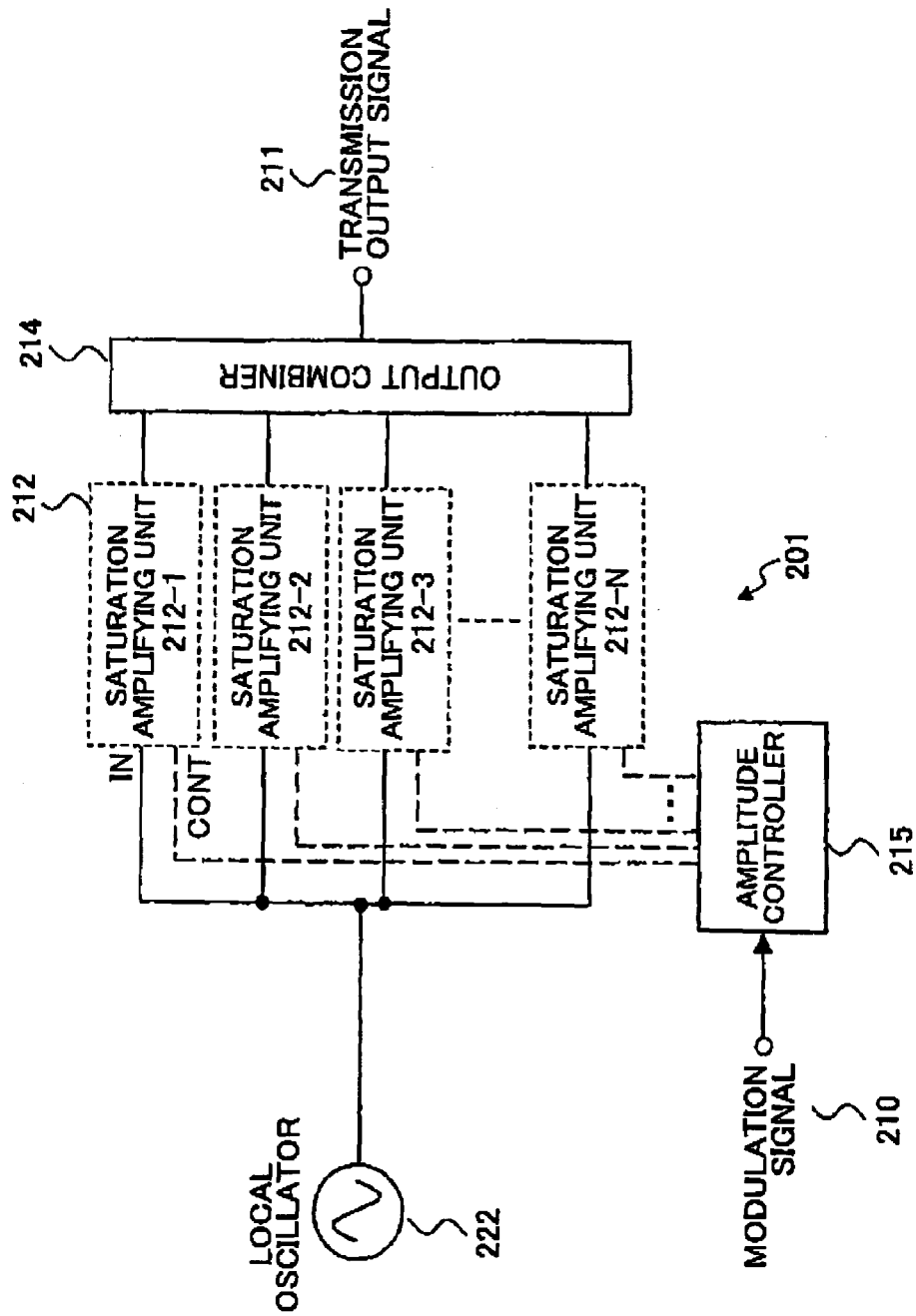
FIG. 12 is a block diagram of a highly efficient transmission signal generator according to an eighth embodiment of the present invention.

FIG. 12 shows a high efficient transmission signal generator 201 according to an eighth embodiment of the present invention. The high efficient transmission generator 201 comprises an constant envelope local oscillator 212, N saturation amplifying units 212 (N is an integer larger than 1), an output combining circuit 214, and an amplitude controller 215. The amplitude controlling unit 15 comprises the amplitude controller 215, and the power amplifying units 12 comprise the saturation amplifying units 212. The output combining circuit 214 may preferably combine outputs from operating saturation amplifying units 212 with no substantial loss. The saturation amplifying units 212 may employ Class F amplifying circuits using for example an FET. Saturation output power from each saturation amplifying unit 212 can be equal to each other, and can be different from each other.

In the eighth embodiment shown in FIG. 12, the local oscillator 222 outputs a cosine wave having a constant amplitude $\cos(\omega_c t + \phi_0)$, wherein $\omega_c = 2\pi f_c$, $f_c$ means a predetermined frequency, and $\phi_0$ is an initial phase. It can be assumed that $\phi_0 = 0$, and the output of the local oscillator 212 is $\cos(\omega_c t)$ without any general discussion. A modulation signal is represented by a(t). The amplitude controller 215 controls the number of operating saturation amplifying units 212, which are turned of in response to an instantaneous value of the modulation signal a(t). The number n of saturation amplifying units 212 is a function of the modulation signal a(t).

A method for determining the number n of saturation amplifying units 212 is explained below with reference to FIG. 21. In FIG. 21, as one example, the number N of saturation amplifying units is 4. FIG. 21(a) shows a wave example of the modulation signal a(t). Variable range of the modulation signal a(t) is from o to $a_o$, as shown in FIG. 21. The number n of saturation amplifying units to be turned on is set as follows.

$$n = \begin{cases} 0, & 0 \leq a(t) \leq \frac{1}{2N}a_0 \\ i, & \frac{2i-1}{2N}a_0 < a(t) \leq \frac{2i+1}{2N}a_0, 1 \leq i \leq (N-1) \\ N, & \frac{N-1}{2N}a_0 < a(t) \leq a_0 \end{cases} \quad \text{Equation 1}$$

Saturation amplifying units 212 to be turned on amplify an output signal from the local oscillator 212, and output $b_0 \cos(\omega_c t)$. Herein $(½)b_0^2$ means saturation output power, the transmission output signal 211 is represented by s(t). When the n saturation amplifying units 212 become ON, $s(t) = n\ b_0\cos(\omega_c t) = b(t)\cos(\omega_c t)$. Herein $b(t) = nb_0$ means an envelope of s(t). FIG. 21(B) shows a wave form b(t). A wave form c(t) shown in FIG. 21(B) is $(4b_0)/a_0$ times of a modulation signal a(t) shown in FIG. 21(A), and therefore a desired envelope. A desired transmission output is represented by $c(t)\cos(\omega_c t)$ herein below. On the other hand, b(t) is a quantized c(t). Supposing that e(t)=b(t)−c(t), e(t) is an error component and has a characteristic of $|e(t)| \leq (½)\ b_0$.

b(t) can be considered to be combination of c(t) and e(t). When the maximum c(t), or $(Nb_0)$ is predetermined, by increasing N, $b_0$ can be established as a small value, and therefore the error component e(t) can be suppressed to a small amount.

In the above explanation, saturation output power of each saturation amplifying unit 212 is equal to each other. But saturation output power of each saturation amplifying units 212 can be a function of power of 2, such as $b_0, 2b_0, 4b_0, \ldots, 2^{N-1} b_0$. In this case, according to combination of saturation amplifying units turned on, b(t) levels of 0, $b_0, 2b_0, 3b_0, \ldots, (2^N-1) b_0$ can be obtained. In this case also, when the maximum amplitude of a desired transmission output signal s(t), that is $(2^N-1) b_0$ is determined, by increasing N, $b_0$ can be established as a small value, and therefore the power of the error component e(t) can be suppressed to a small amount lower than predetermined value.

In the embodiment shown in FIG. 12, each saturation amplifying units operates at its saturation point when turning on, and therefore is highly efficient. If each saturation amplifying unit 212 has equal efficiency $\eta$, the total efficiency $\eta_T$ of the power amplifier shown in FIG. 12 is represented by Equation 2 and therefore high efficient.

$$\eta_T = \frac{\sum_i P_i}{\sum_i \frac{P_i}{\eta}} = \eta \quad \text{Equation 2}$$

In Equation 2, $P_i$ means output power of saturation power amplifying units 212 turned on.

In the embodiment shown in FIG. 12, the transmission output signal 211 is AM wave modulated with a modulation signal 210.

Ninth Embodiment

Figure 13:
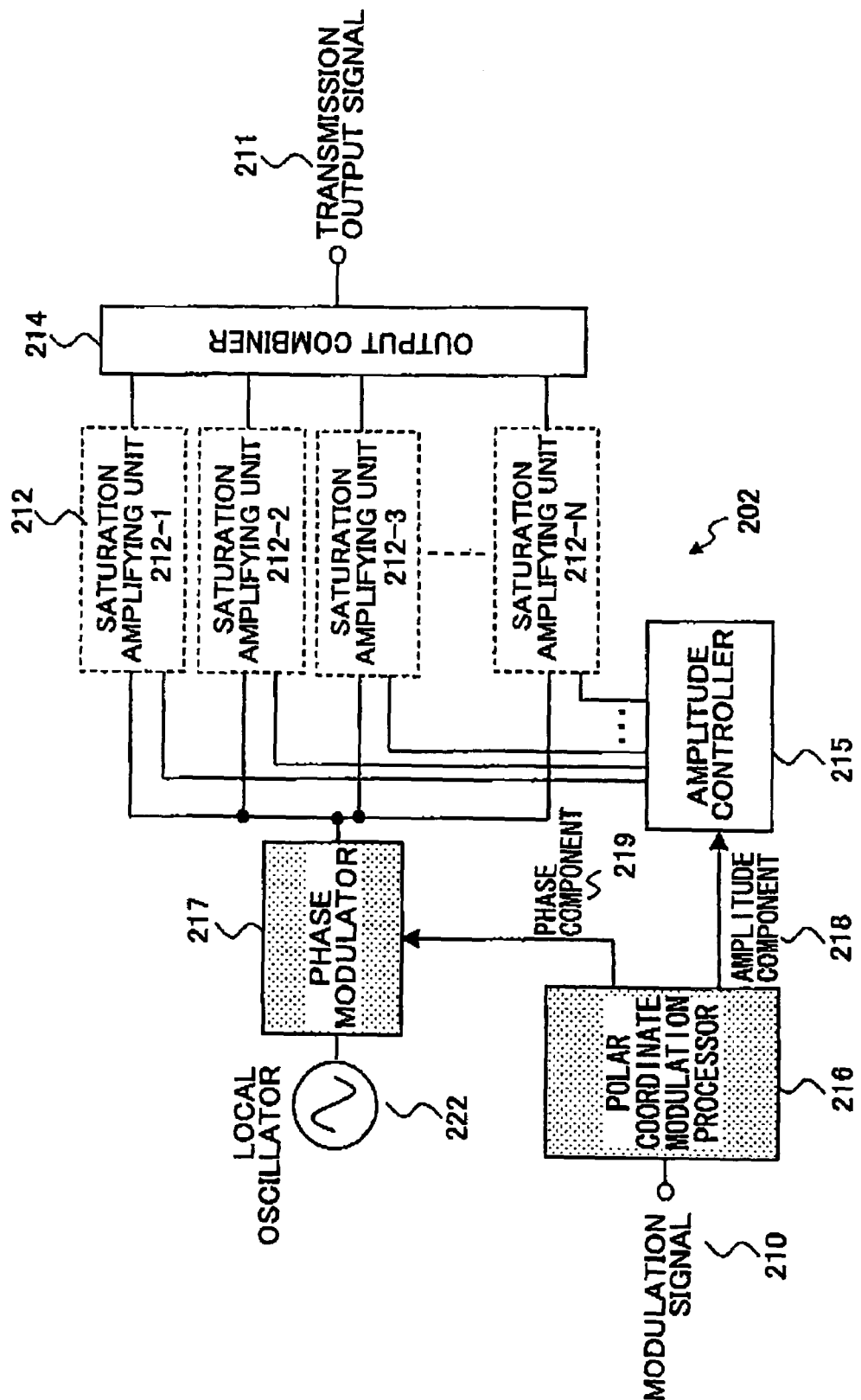
FIG. 13 is a block diagram of a highly efficient transmission signal generator according to a ninth embodiment of the present invention.

FIG. 13 shows a high efficient transmission signal generator 202 according to a ninth embodiment of the present invention. The high efficient transmission generator 202 according to the ninth embodiment comprises an constant envelope local oscillator 222, N saturation amplifying units 212 (N is an integer larger than 1), an output combining circuit 214, and an amplitude controller 215. The transmission generator 202 further comprises a polar coordinate modulation processor 216, and a phase modulator 217. This ninth embodiment is different from the eighth embodiment shown in FIG. 12 in that this embodiment includes the polar coordinate modulation processor 216 for separating the modulation signal 210 into an amplitude component 218 and a phase component 219, and the phase modulator 217.

The modulation signal 210 is a complex signal and can be represented by a(t) exp (j$\phi$(t)) . Herein a(t) and $\phi$(t) means the amplitude component and the phase component of the modulation signal 210. The polar coordinate modulation processor 216 separates the modulation signal 210 into the amplitude component 218 and the phase component 219, and outputs the amplitude component a(t) and the phase component $\phi$(t). In the phase modulator 217, an output signal $\cos(\omega_c t)$ from the local oscillator 212 is phase-modulated with $\phi$(t), and phase-modulated wave $\cos(\omega_c t + \phi(t))$ is output. The phase modulated wave is amplitude-modulated with a(t) by the plural saturation amplifying units 212, output combiner 214 and the amplitude controller 215. As a result, the transmission output signal 211 becomes a modulated wave $\cos(\omega_c t + \phi(t))$ that is amplitude/phase-modulated with the modulation signal 210, that is a quadrature amplitude modulated wave (QAM wave).

In the embodiment shown in FIG. 13 also, each saturation amplifying units 212 operates at its saturation point when turning on, and therefore is high efficiency. Since the total efficiency $\eta_T$ of the power amplifier is represented by Equation 2 and $\eta_T$-$\eta$, and therefore high efficiency.

Tenth Embodiment

Figure 14:
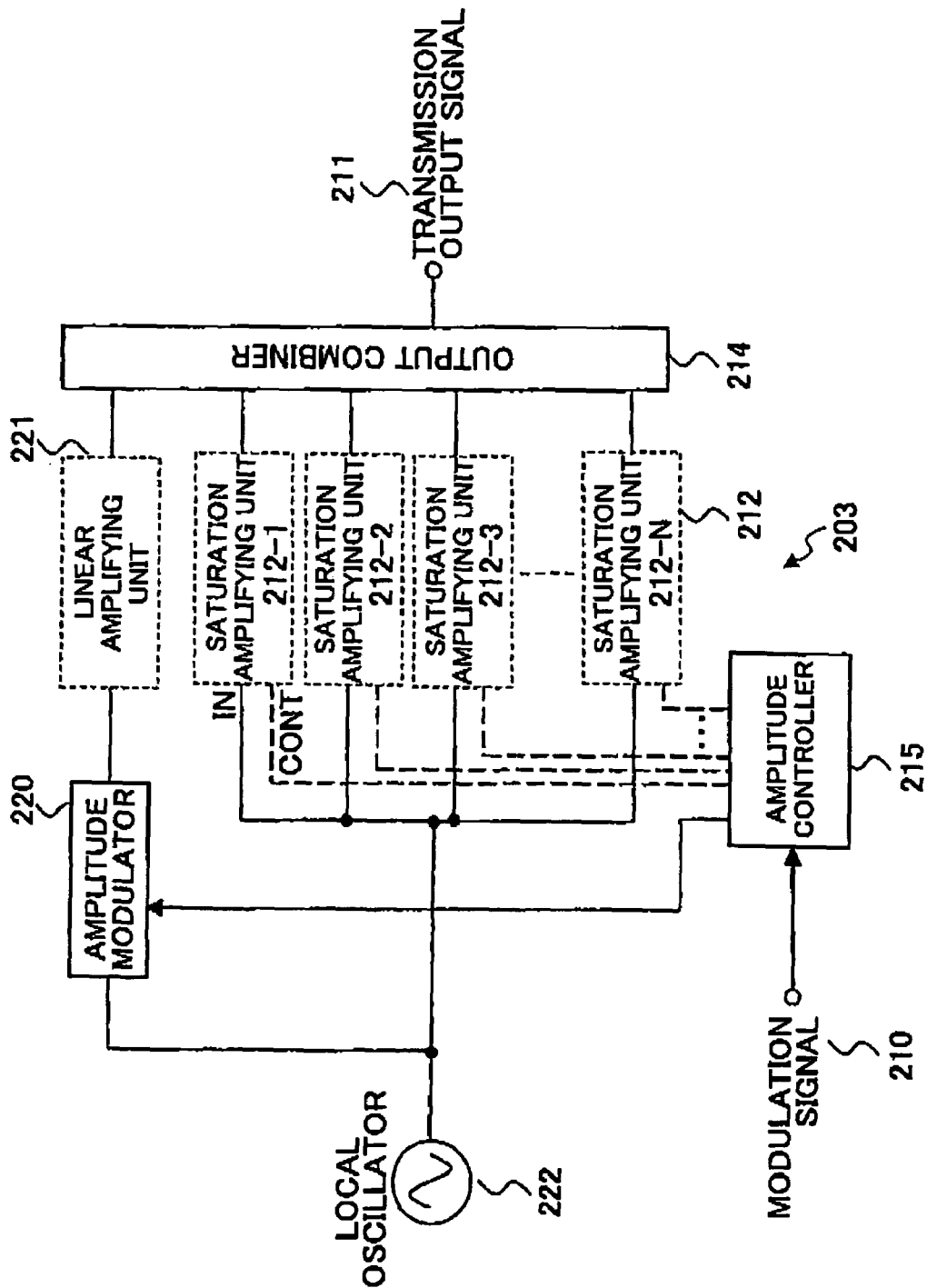
FIG. 14 is a block diagram of a highly efficient transmission signal generator according to a tenth embodiment of the present invention.

FIG. 14 shows a high efficient transmission signal generator 203 according to a tenth embodiment of the present invention. The high efficient transmission generator 203 according to the ninth embodiment is different from the ninth embodiment shown in FIG. 13 in that this embodiment includes an amplitude modulator 220 and a linear amplifying unit 221. The operation of this embodiment is explained with reference to FIG. 21. If there is no output form the linear amplifying unit 221, an amplitude of the transmission output signal 211 is like a curve b(t) shown in FIG. 21(B). Supposing that a gain of the linear amplifying unit 221 is k, and the amplitude controller 215 gives $-(1/k) e(t)=-(1/k) [b(t)-c(t)]$ to the amplitude modulator 220. The amplitude modulator 220 modulates the output from the local oscillator 222 with $-(1/k) e(t)$, and outputs $-(1/k)e(t) \cos(\omega_c t)$. Therefore, the linear amplifying unit 221 outputs $-e(t)\cos(\omega_c t)$. Taking this into consideration, an amplitude of the transmission output signal 211 becomes $-e(t)+b(t)=c(t)$. The c(t) is an envelope of a desired s(t). Therefore, in the tenth embodiment shown in FIG. 14, the transmission output signal 211 becomes a desired transmission signal.

The total efficiency $\eta_T$ in the embodiment shown in FIG. 14 becomes $\eta_T = \{P_s(t)/(P_{DC1}+P_{DC2})\}$. Herein $P_s(t)=(\frac{1}{2}) c^2(t)$, $P_{DC1}$ is DC power consumed in the linear amplifying unit 221, $P_{DC2}$ is a sum of DC powers consumed in each saturation amplifying unit 212 turned on. If an efficiency of each saturation amplifying unit 212 is equal to $\eta$, $P_{DC2}=(\frac{1}{2}) b^2(t)/\eta \approx P_s(t)/\eta$. Therefore $\eta_T$ is represented by Equation 3.

$$\eta_T = \frac{1}{\frac{P_{DC1}}{P_S(t)} + \frac{1}{\eta}}$$

Equation 3

In Equation 3, as $P_s(t)$ varies with time, $\eta_T$ also varies with time. However, its time average $\bar{\eta}_T$ is represented by Equation 4.

$$\bar{\eta}_T = \frac{1}{\frac{P_{DC1}}{P_S(t)} + \frac{1}{\eta}}$$

Equation 4

A linear amplifier is low efficiency. However, as explained with the eighth embodiment shown in FIG. 12, by increasing the number N of the saturation amplifying units 212, e(t) can be suppressed to low, and the output signal of the linear amplifying unit 221 can be significantly reduced. In this case, the efficiency of the linear amplifying unit 221 is low, but $P_{DC1}$ is very small. Therefore, in Equation 4, $\eta_T$ becomes $\eta_T$(time average)$\approx \eta$. Accordingly, viewing from averaging point, the total efficiency in the tenth embodiment shown in FIG. 14 becomes high efficient.

Eleventh Embodiment

Figure 15:
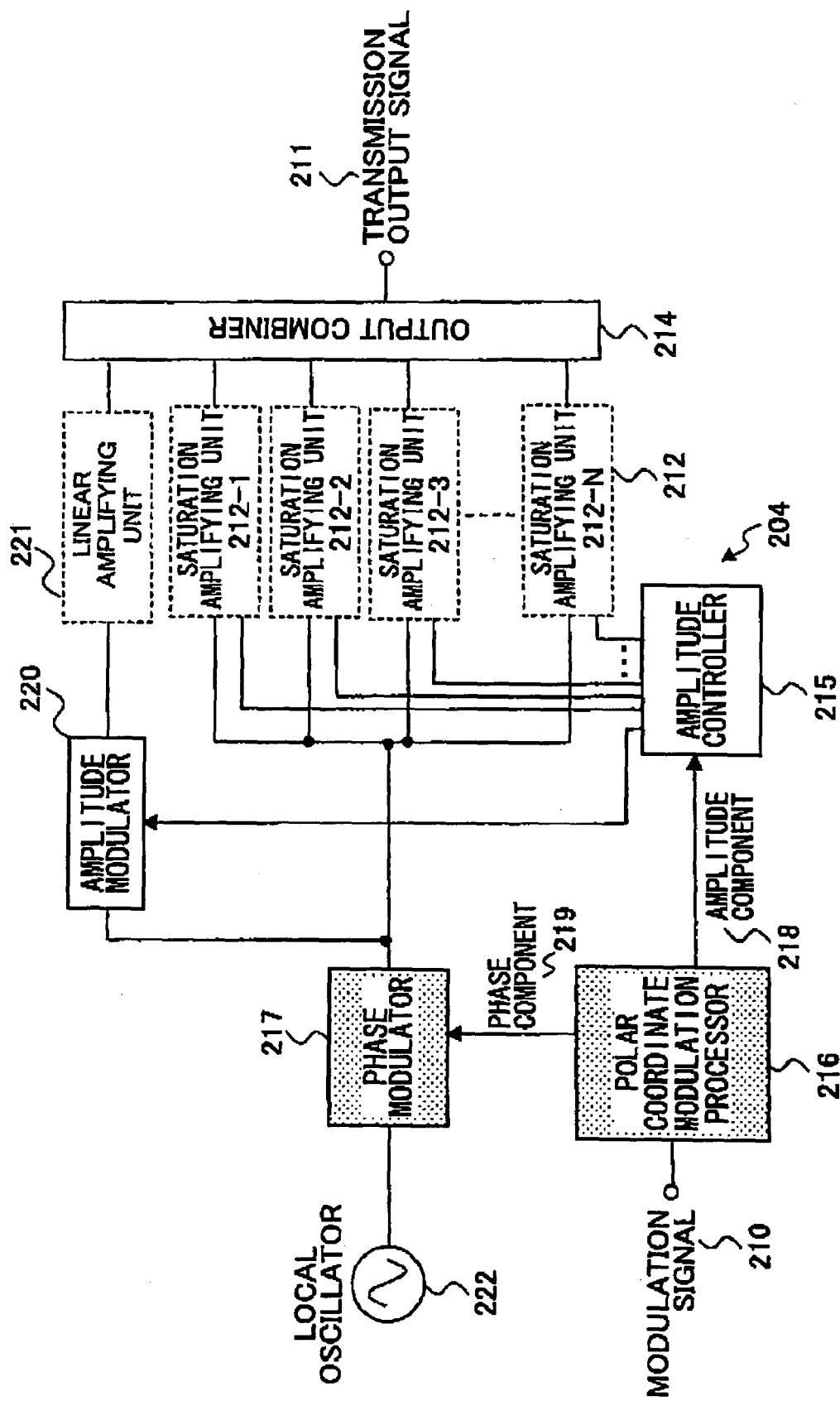
FIG. 15 is a block diagram of a highly efficient transmission signal generator according to an eleventh embodiment of the present invention.

FIG. 15 shows a high efficient transmission signal generator 204 according to an eleventh embodiment of the present invention. The high efficient transmission generator 204 according to the eleventh embodiment is different from the ninth embodiment shown in FIG. 13 in that this embodiment includes an amplitude modulator 220 and a linear amplifying unit 221. The high efficient transmission generator 204 according to the eleventh embodiment is different from the tenth embodiment shown in FIG. 14 in that in this embodiment the output signal from the local oscillator 222 is phase-modulated by a phase modulator 217 and supplied to each of the saturation amplifying units 212 and the amplitude modulator 220. The amplitude modulator 220 and the linear amplifying unit 221 operate in the same manner as the tenth embodiment shown in FIG. 14.

In this embodiment, the linear amplifying unit 221 outputs $-e(t) \cos(\omega_c t+\phi(t))$, the transmission output signal 211 becomes $c(t) \cos(\omega_c t+\phi(t))$, which is a desired transmission output. Like in the tenth embodiment shown in FIG. 14, the total efficiency is high viewing from averaging point.

Twelfth Embodiment

Figure 16:
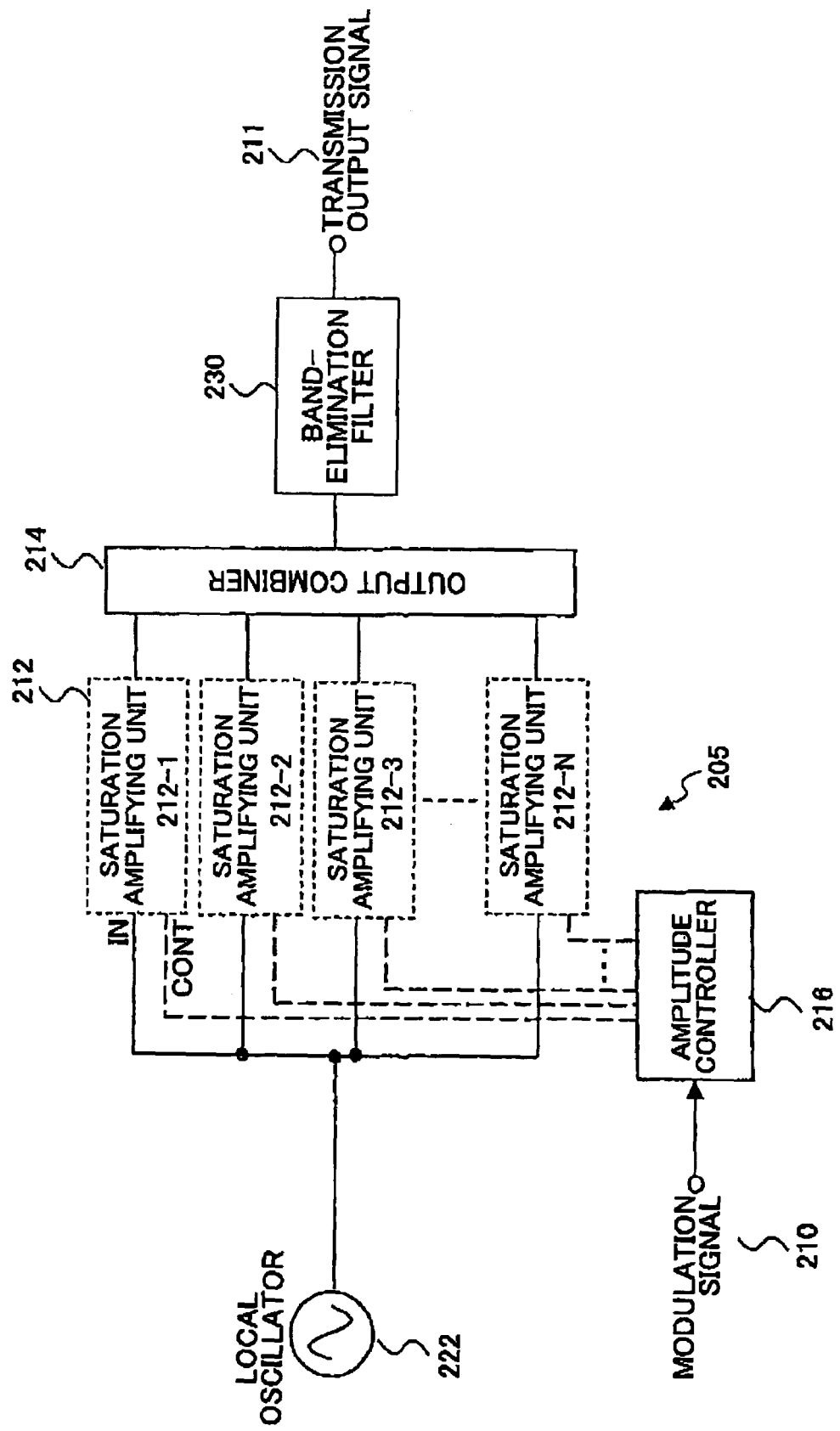
FIG. 16 is a block diagram of a highly efficient transmission signal generator according to a twelfth embodiment of the present invention.

FIG. 16 shows a high efficient transmission signal generator 205 according to a twelfth embodiment of the present invention. The high efficient transmission generator 205 according to the twelfth embodiment is different from the eighth embodiment shown in FIG. 12 in that this embodiment includes a band-elimination filter 230 after the output combiner 214. An output from the band-elimination filter 230 becomes the transmission output signal 211.

In the twelfth embodiment, the band-elimination filter 230 eliminates the aforementioned error component e(t) out of the transmission signal bandwidth to smooth the envelope of the transmission output signal 211, and eliminates the harmonic component output from the saturation amplifying unit 212. Also in the ninth embodiment shown in FIG. 13, a smoothing filter 230 can be provided after the output combiner 214.

Also in the tenth and eleventh embodiments shown in FIGS. 14 and 15, a smoothing filter or band-elimination filter 230 can be provided after the output combiner 214. In these cases, the band-elimination filter 230 eliminates harmonic component output from the saturation amplifying units 212.

Thirteenth Embodiment

Figure 17:
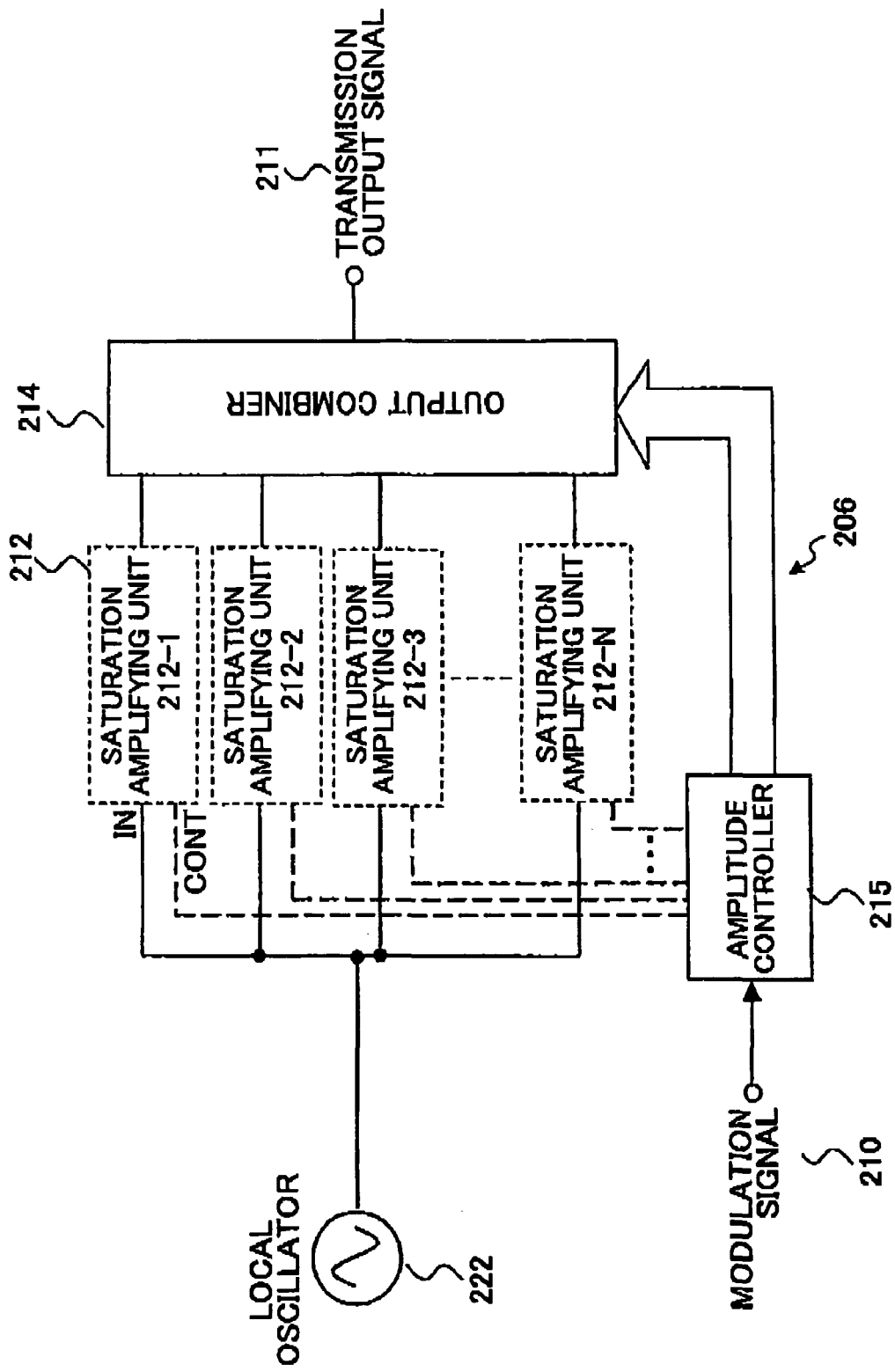
FIG. 17 is a block diagram of a highly efficient transmission signal generator according to a thirteenth embodiment of the present invention.

FIG. 17 shows a high efficient transmission signal generator 206 according to a thirteenth embodiment of the present invention. The high efficient transmission generator 206 according to the thirteenth embodiment is different from the eighth embodiment shown in FIG. 12 in that in this embodiment the output combiner 214 is controlled by the amplitude controller 215.

In the thirteenth embodiment, the amplitude controller 215 adjusts electric characteristics of the output combiner 214 in accordance with on/off conditions of each of the saturation amplifying units 212, to reduce power loss in the output combiner 214.

Other Embodiments

FIG. 18 shows examples of output combiner used in a high efficient transmission signal generator according to other embodiment of the present invention. In any of the above mentioned eighth–eleventh embodiments, the output combiner 214 may have a structure as shown in FIG. 18(A). The output combiner 214 shown in FIG. 18(A) is a current combination circuit for simply connecting each output from each of the saturation amplifying units 212.

FIG. 18(B) shows another example of output combiner 214. The output combiner 214 shown in FIG. 18(B) connects each output from each of the saturation amplifying units 212, and outputs the combined signal via an output matching circuit 280.

FIG. 18(C) shows further different example of output combiner 214. In any of the above mentioned eighth–eleventh embodiments, the output combiner 214 may employ a structure shown in FIG. 18(C). The output combiner 214 shown in FIG. 18(C) connects each output from each of the saturation amplifying units 212, outputs the combined signal via a variable-output matching circuit 281. The variable-output matching circuit 281 adjusts its electric characteristics in accordance with on/off conditions of each of the saturation amplifying units 212 under control of the amplitude controller 215, in order to reduce electric loss in the output combiner 214.

Figure 19:
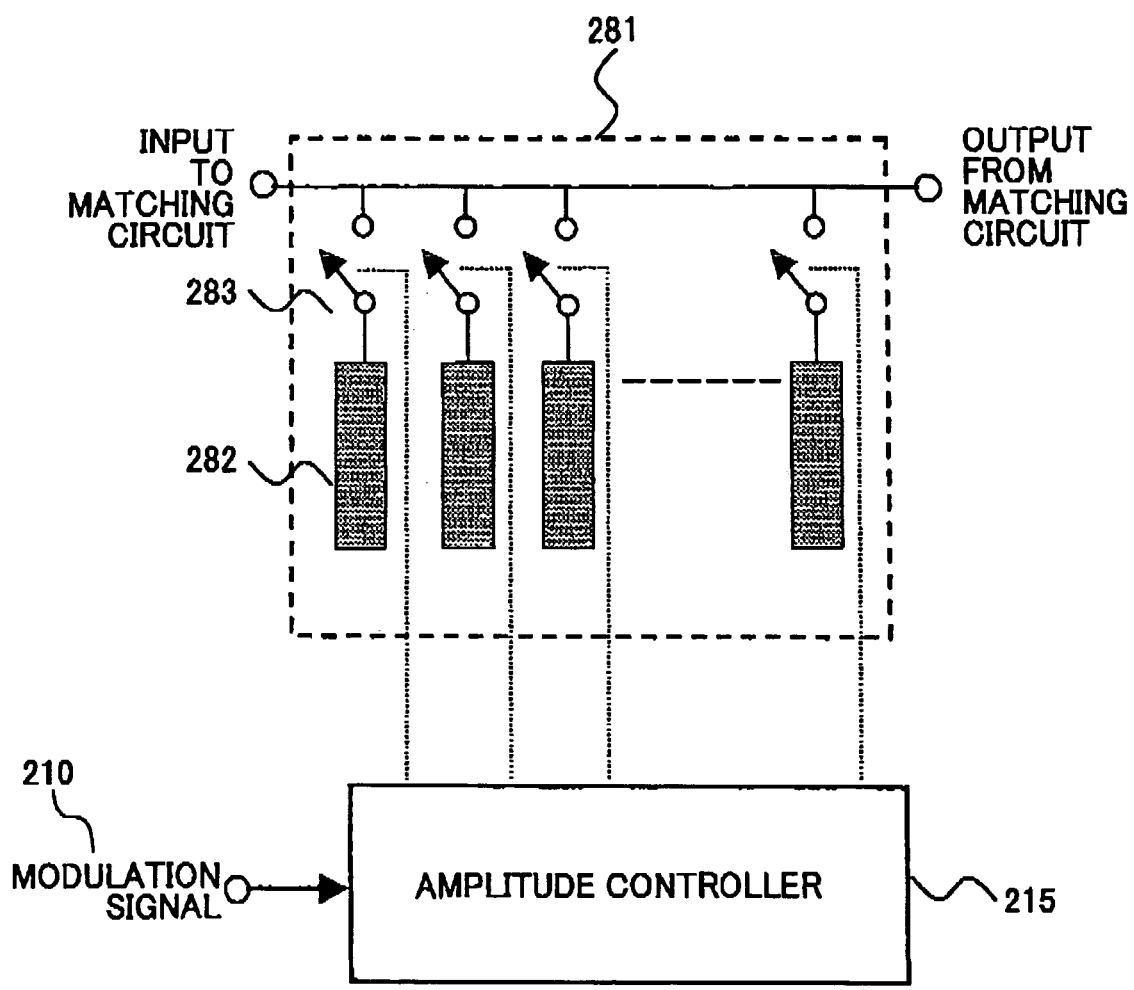
FIG. 19 is a block diagram of a variable output matching circuit according to an embodiment of the present invention.

FIG. 19 shows an example of the variable-output matching circuit shown in FIG. 18. The variable-output matching circuit 281 shown in FIG. 19 comprises a plurality of open or grounded reactance devices 282 arranged in parallel. Switches 283 controlled by the amplitude controller 215 can switch the open/grounded conditions of each reactance device 282. Electric characteristics of the variable-output matching circuit 281 is adjusted depending on the number of grounded parallel reactance devices 282.

Figure 20:
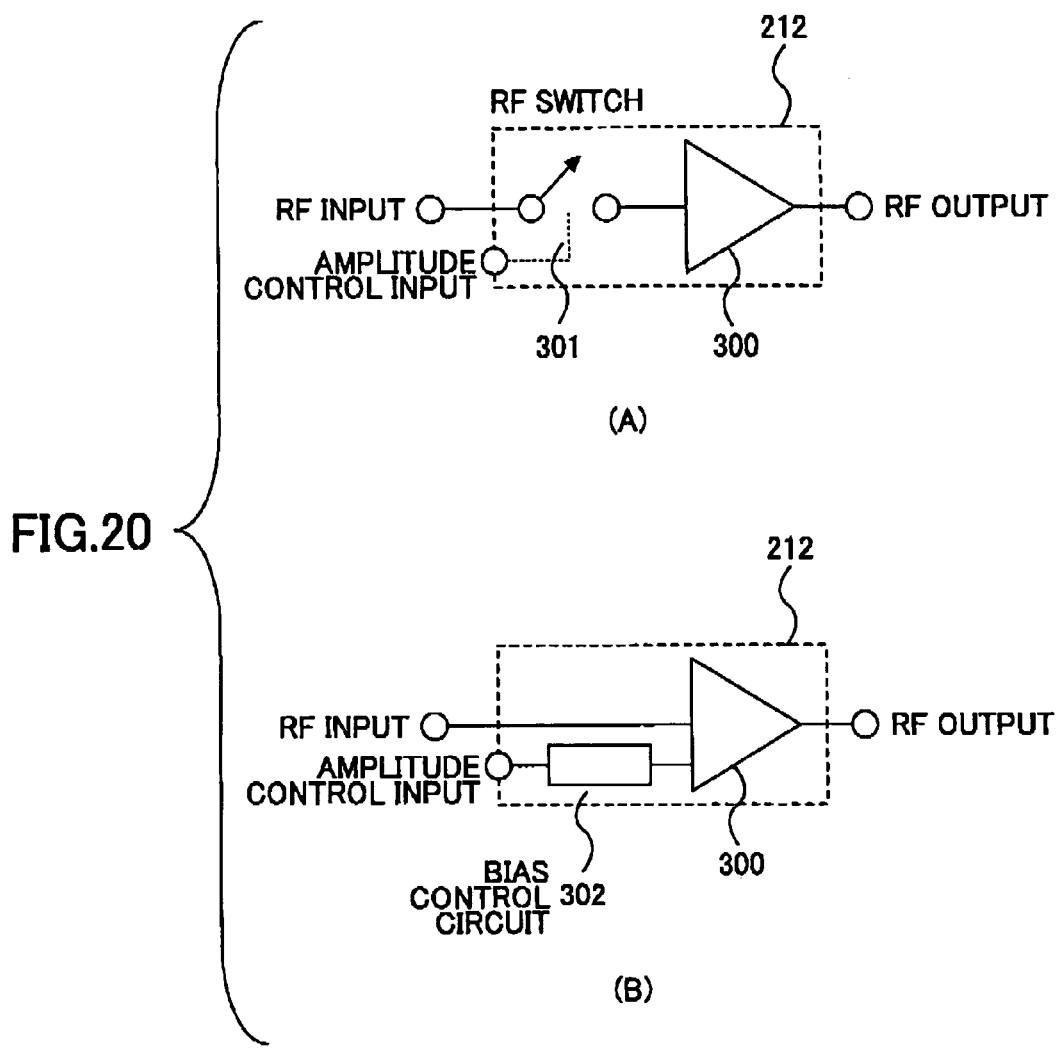
FIG. 20 is a block diagram of an ON/OFF structure of a saturation output unit according to an embodiment of the present invention.

FIG. 20 shows concrete structures for controlling the on/off conditions of the saturation amplifying units 212 by the amplitude controller in any of the above embodiments. For example, in a structure shown in FIG. 20 (A), a saturation amplifying unit 212 comprises a saturation amplifier 300 and an RF switch 301 provided at the input side. The amplitude controller 215 controls the on/off conditions of the RF switch 301 via an amplitude control input terminal of the RF switch 301. Therefore, the on/off of the saturation amplifying unit 212 is attained.

In another structure shown in FIG. 20(B), a saturation amplifying unit 212 comprises a saturation amplifier 300 and a bias control circuit 302. The amplitude controller 215 turns on/off the saturation amplifying units 212 by controlling the bias control circuit 302 via an amplitude control input terminal thereof.

The present application is based on Japanese Priority Applications Nos. 2003-289356 filed on Aug. 7, 2003 and 2003-318589 filed on Sep. 10, 2003 with the Japanese Patent Office, the entire contents of which are hereby incorporated by reference.

What is claimed is:

1. A power amplifier for receiving and amplifying an input signal and outputting an output signal, comprising:
   N power amplifying units (N is an integer larger than 1) connected in parallel so as to output amplified signals in response to the input signal;
   an output combining unit for combining the output signals from the N power amplifying units and outputting a combined signal as the output signal of the power amplifier; and
   an amplitude controlling unit for selectively turning ON each of the N power amplifying units based on an amplitude of the input signal,
   the amplitude controlling unit comprising:
   N amplitude adjusters (N is an integer larger than 1) connected in parallel for adjusting the amplitude of the input signal of the power amplifier; and
   a controller for selectively turning ON each of the N power amplifying units and controlling the amplitude adjusters so that an amplitude of the output signal becomes a substantially continuous function with respect to the amplitude of the input signal.

2. The power amplifier as claimed in claim 1, wherein the controller selectively turns ON each of the N power amplifying units and controls the amplitude adjusters in response to the amplitude of the input signal.

3. The power amplifier as claimed in claim 1, wherein the controller selectively turns ON each of the N power amplifying units and controls the amplitude adjusters so that the amplitude of the output signal has a linear relation with the amplitude of the input signal.

4. The power amplifier as claimed in claim 1, wherein each of the N power amplifying units has substantially the same maximum output power Ps.

5. The power amplifier as claimed in claim 4, wherein, in order that the output signal varies within a range from (r−1)Ps to rPs (r is an integer from 1 to N), the controller turns ON r power amplifying units and controls corresponding r amplitude adjusters so that powers of the r power amplifying units similarly vary within a range from [(r−1)/r]Ps to Ps.

6. The power amplifier as claimed in claim 1, wherein, the maximum power of the ith (i=2, . . . , N) power amplifying unit is twice the maximum power of the (i−1)th power amplifying unit.

7. The power amplifier as claimed in claim 6, wherein, in order that the output signal varies within a range from (r−1)Ps to rPs (Ps is the maximum power of the first power amplifying unit; r is an integer from 1 to (2N−1)), the controller turns ON power amplifying units determined by an N-digit binary number of r and controls corresponding amplitude adjusters so that the power of the ith turned-ON-power amplifying unit varies within a range from [(r−1)/r] 2(i−1)Ps to 2(i−1)Ps.

8. The power amplifier as claimed in claim 1, wherein the controller controls the amplitude adjusters so as to control the power of the output signal.

9. The power amplifier as claimed in claim 1, wherein the input signal is supplied via an amplitude adjuster for power control to the amplitude adjusters.

10. The power amplifier as claimed in claim 1, further comprising a local oscillator outputting an constant envelope signal, the power amplifier receiving a modulation signal as the input signal of the power amplifier and outputting an amplified modulation signal as the output signal of the power amplifier, wherein the N power amplifying units comprises N saturation amplifying units connected in parallel so as to amplify the constant envelope signal from the local oscillator; and wherein the controller is an amplitude controller for selectively turning ON each of the N saturation amplifying units based on an amplitude of the modulation signal.

11. The power amplifier as claimed in claim 10, further comprising:
   a polar coordinate modulation processor for separating the received modulation signal into an amplitude component and a phase component, and supplying the amplitude component to the amplitude controller; and
   a phase modulator for receiving the phase component from the polar coordinate modulation processor, phase-modulating the constant envelope signal from the local oscillator with the phase component, and supplying a phase-modulation signal to the saturation amplifying units.

12. The power amplifier as claimed in claim 10, further comprising:
an amplitude modulator for amplitude modulating the constant envelope signal from the local oscillator under the control of the amplitude controller; and
a linear amplifying unit for linearly amplifying an output signal from the amplitude modulator and supplying an output signal to the output combining unit.

13. The power amplifier as claimed in claim 11, further comprising:
an amplitude modulator for amplitude modulating the phase-modulated signal from the phase modulator under the control of the amplitude controller; and
a linear amplifying unit for linearly amplifying an output signal from the amplitude modulator and supplying an output signal to the output combining unit.

14. The power amplifier as claimed in claim 10, further comprising:
a band-elimination filter placed after the output combining unit.

15. The power amplifier as claimed in claim 10, wherein electric characteristics of the output combining unit are controlled by the amplitude controller.

16. The power amplifier as claimed in claim 10, wherein the output combining unit combines output signals from the saturation amplifying units, and outputs a combined signal via an output matching circuit.

17. The power amplifier as claimed in claim 16, wherein the output matching circuit is a variable-output matching circuit controlled by the amplitude controller.

18. The power amplifier as claimed in claim 17, wherein the variable-output matching circuit comprises a plurality of parallel reactance devices, grounding conditions of the reactance devices being controlled by the amplitude controller.

19. The power amplifier as claimed in claim 10, wherein each of the saturation amplifying units comprises:
a saturation amplifier for saturation amplifying;
a bias controlling circuit placed at an input side of the saturation amplifier, and
an RF switch, ON or OFF condition of which is controlled by the amplitude controller; or
a bias control circuit supplying a bias voltage to the saturation amplifier, condition of the bias voltage being controlled by the amplitude controller.

* * * * *

UNITED STATES PATENT AND TRADEMARK OFFICE
CERTIFICATE OF CORRECTION

PATENT NO.      : 7,119,621 B2                                    Page 1 of 1
APPLICATION NO. : 10/912116
DATED           : October 10, 2006
INVENTOR(S)     : Chen et al.

It is certified that error appears in the above-identified patent and that said Letters Patent is hereby corrected as shown below:

On the title page, Item (30), the Foreign Application Priority Data should read:

--      (30)            Foreign Application Priority Data

Aug. 7, 2003    (JP) ............................. 2003-289356
        Sep. 10, 2003   (JP) ............................. 2003-318589   --

On the title page, the Assignee: Item (73) should read:

--  (73)   Assignee:   NTT DoCoMo, Inc., Tokyo (JP)   --

Signed and Sealed this

Twenty-sixth Day of December, 2006

JON W. DUDAS
*Director of the United States Patent and Trademark Office*